(12) United States Patent
Pramod et al.

(10) Patent No.: US 11,349,430 B2
(45) Date of Patent: May 31, 2022

(54) REGENERATIVE CURRENT LIMITING OF SYNCHRONOUS MOTOR DRIVES

(71) Applicant: STEERING SOLUTIONS IP HOLDING CORPORATION, Saginaw, MI (US)

(72) Inventors: Prerit Pramod, Saginaw, MI (US); Krishna Namburi, Saginaw, MI (US); Zhe Zhang, Fenton, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 0 days.

(21) Appl. No.: 16/653,429

(22) Filed: Oct. 15, 2019

(65) Prior Publication Data

US 2021/0111661 A1 Apr. 15, 2021

(51) Int. Cl.
*H02P 29/40* (2016.01)
*G01R 19/00* (2006.01)
*H02P 3/14* (2006.01)
*H02P 9/12* (2006.01)

(52) U.S. Cl.
CPC .......... *H02P 29/40* (2016.02); *G01R 19/0092* (2013.01); *H02P 3/14* (2013.01); *H02P 9/123* (2013.01)

(58) Field of Classification Search
CPC . H02P 29/40; H02P 3/14; H02P 9/123; G01R 19/0092
See application file for complete search history.

(56) References Cited

U.S. PATENT DOCUMENTS

| 8,896,244 | B2 | 11/2014 | Kleinau | |
|---|---|---|---|---|
| 9,531,311 | B2 | 12/2016 | Collier-Hallman | |
| 10,454,395 | B2 | 10/2019 | Li et al. | |
| 2004/0100221 | A1* | 5/2004 | Fu | H02P 25/03 318/700 |
| 2008/0303475 | A1* | 12/2008 | Patel | H02P 21/141 318/634 |
| 2014/0265953 | A1* | 9/2014 | Collier-Hallman | H02P 21/22 318/400.02 |

* cited by examiner

*Primary Examiner* — Kawing Chan
*Assistant Examiner* — Bradley R Brown
(74) *Attorney, Agent, or Firm* — Dickinson Wright PLLC

(57) ABSTRACT

Technical solutions are described for controlling operation of an inverter to manage voltage upon a direct current (DC) bus and regenerative power (current) provided to a battery. A control system and method are provided to control operation of an electric machine using a controller. More specifically, the controller is configured to calculate a current-based torque limit to satisfy a regenerative current limit, and a voltage-based torque limit to satisfy a voltage limit constraint of the DC bus. The controller is configured to calculate a torque limit to satisfy the regenerative current and voltage limits of the DC bus, and to command a plurality of switches within the inverter to generate a direct-axis current from the electric machine corresponding to a torque demand and according to the torque limit. The proposed system and method provide for motor current that exceed a demagnetizing current limit of the electric machine.

20 Claims, 16 Drawing Sheets

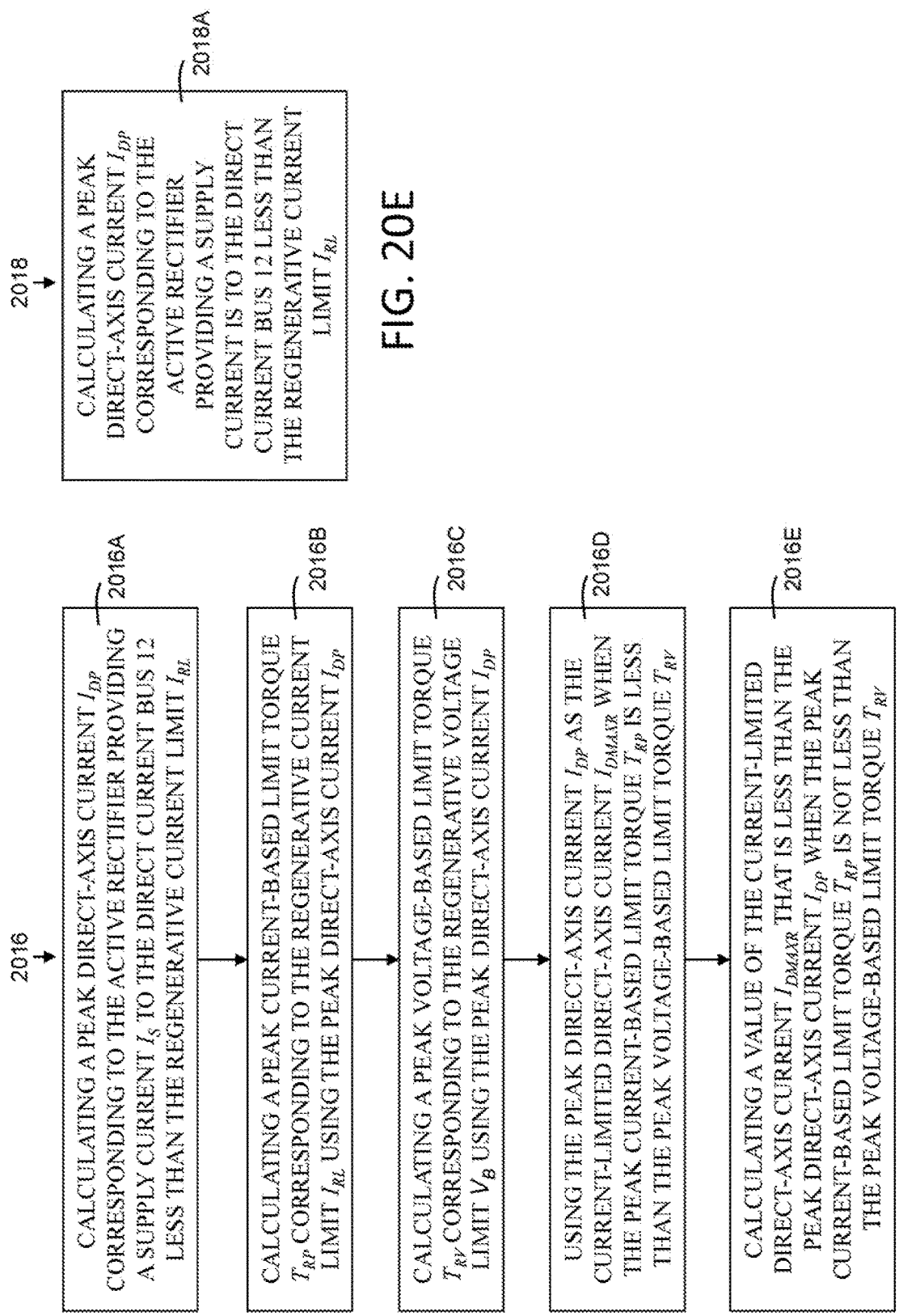

REGENERATIVE CURRENT LIMITING OF SYNCHRONOUS MOTOR DRIVES

BACKGROUND

The present application is generally related to methods and systems for controlling operation of an electric machine. More specifically, the present application is related to methods and systems for managing regenerative current from an electric machine. Example embodiments are provided in electric power steering (EPS) systems.

Modern electric power steering (EPS) systems employ permanent magnet synchronous motors (PMSM) based electric drives that provide torque assistance to the driver. A vehicle battery is commonly used as a power source for EPS systems. Since multiple electronic systems in the vehicle consume power from the vehicle battery, it is essential for each system to actively manage the power (or current) it draws from or supplies back to the battery. With the advent and proliferation of electric vehicles, it is now even more critical to protect the battery through proper management of currents and voltages.

SUMMARY

According to one or more embodiments, a control system for controlling operation of an electric machine comprises an inverter that is operable to rectify current from alternating current phase buses of the electric machine to a direct current bus with switches. The control system also comprises a controller that is operable to: calculate a voltage-based torque limit corresponding to a voltage limit constraint of the direct current bus; to calculate a current-based torque limit corresponding to a regenerative current limit of the direct current bus; and to calculate a torque limit defined by the current-based torque limit when the current-based torque limit is less than the voltage-based torque limit. The controller is also operable to operate the switches of the inverter to produce an output torque corresponding to a torque demand and according to the torque limit. The controller is also operable to operate the switches to regulate a direct-axis current not to exceed a maximum d-axis current, with the maximum d-axis current defined by one of a demagnetization current limit of the electric machine or a peak d-axis current that corresponds to a quadrature-axis current having a real solution.

According to one or more embodiments, a method of controlling operation of an electric machine is provided. The method comprises calculating a voltage-based torque limit corresponding to a voltage limit constraint of a direct current bus; calculating a current-based torque limit corresponding to a regenerative current limit of the direct current bus; calculating a torque limit defined by the current-based torque limit when the current-based torque limit is less than the voltage-based torque limit; commanding a plurality of switches within an inverter to cause the electric machine to produce an output torque corresponding to a torque demand and according to the torque limit; and commanding the plurality of switches to regulate a direct-axis current not to exceed a maximum d-axis current, the maximum d-axis current defined by one of a demagnetization current limit of the electric machine or a peak d-axis current that corresponds to a quadrature-axis current having a real solution.

According to one or more embodiments, a method of controlling operation of an electric machine is provided. The method comprises: calculating a voltage-limited direct-axis current of the electric machine corresponding to the voltage limit constraint of the direct current bus; calculating a current-limited direct-axis current of the electric machine corresponding to the regenerative current limit of the direct current bus; calculating a final direct-axis current limit as a largest one of the voltage-limited direct-axis current and the current-limited direct-axis current; and commanding a plurality of switches within an inverter to generate a direct-axis current that satisfies the final direct-axis current limit.

These and other advantages and features will become more apparent from the following description taken in conjunction with the drawings.

BRIEF DESCRIPTION OF THE DRAWINGS

The subject matter of the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIG. 20D depicts a flow diagram showing sub-steps of the method of FIGS. 20A-20B; and FIG. 20E depicts a flow diagram showing a sub-step of the method of FIGS. 20A-20B.

DETAILED DESCRIPTION

Referring now to the figures, where the present disclosure will be described with reference to specific embodiments, without limiting the same, it is to be understood that the disclosed embodiments are merely illustrative of the present disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

As used herein the terms module and sub-module refer to one or more processing circuits such as an application specific integrated circuit (ASIC), an electronic circuit, a processor (shared, dedicated, or group) and memory that executes one or more software or firmware programs, a combinational logic circuit, and/or other suitable components that provide the described functionality. As can be appreciated, the sub-modules described below can be combined and/or further partitioned.

An active regenerative current management (limiting) algorithm is proposed in this disclosure. The algorithm manages the regenerative power (current) provided to a battery by actively controlling the motor currents. In addition to directly limiting the allowable torque, a feature is proposed where the efficiency of the electric drive is reduced in order to produce higher torque while still honoring an externally-imposed regenerative current limit. The proposed supervisory control structure is very modular, which enables turning-off the feature to enable maximum efficiency operation by reducing the torque only. In addition to being modular, the proposed algorithm is both optimal in terms of torque and efficiency management, and further, is relatively computationally simple.

In various embodiments, the electric machine is configured to perform at least one of: applying an assist torque to a steering system of a vehicle, and controlling the steering system. In some embodiments, the proposed system and method ensure that the motor current is always maintained below a demagnetizing current limit of the motor. In other embodiments, the proposed system and method may not limit the motor current to the demagnetizing current limit of the motor. For example, a motor in an EPS system may have a motor current that exceeds the demagnetizing current limit of the motor during dynamic steering events such as braking over curbs. Such applications may be relatively infrequent and/or short in duration that risks of demagnetizing the motor may be relatively low.

Figure 1:
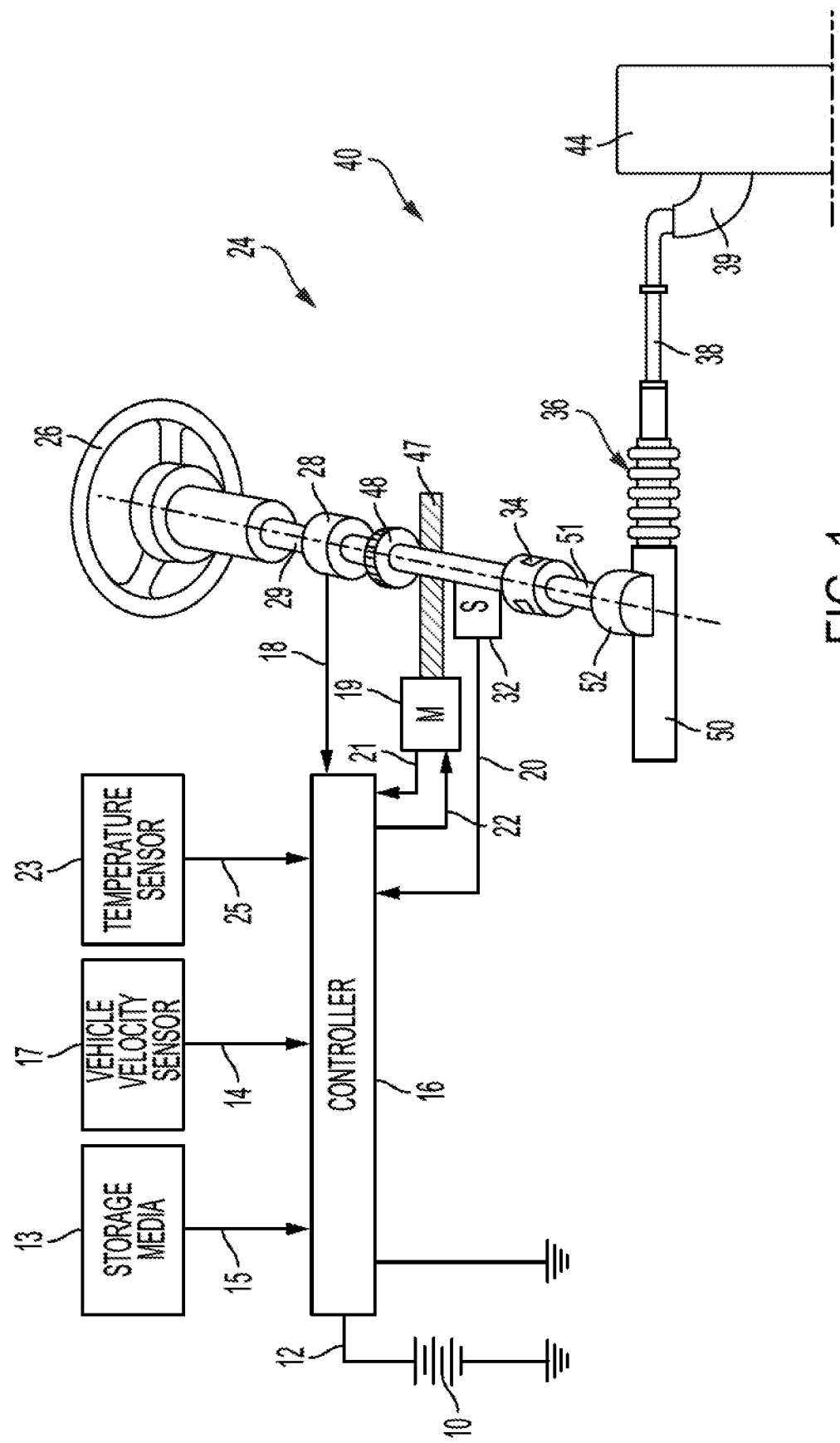
FIG. 1 depicts a block diagram of an exemplary embodiment of an electric power steering system according to aspects of the present disclosure.

Referring now to the figures, where the technical solutions will be described with reference to specific embodiments, without limiting same, FIG. 1 is an exemplary embodiment of an electric power steering system (EPS) 40 suitable for implementation of the disclosed embodiments. The steering mechanism 36 is a rack-and-pinion type system and includes a toothed rack (not shown) within housing 50 and a pinion gear (also not shown) located under gear housing 52. As the operator input, hereinafter denoted as a steering wheel 26 (e.g., a hand wheel and the like), is turned, the upper steering shaft 29 turns and the lower steering shaft 51, connected to the upper steering shaft 29 through universal joint 34, turns the pinion gear. Rotation of the pinion gear moves the rack, which moves tie rods 38 (only one shown) in turn moving the steering knuckles 39 (only one shown), which turn a steerable wheel(s) 44 (only one shown).

Electric power steering assist is provided through the control apparatus generally designated by reference numeral 24 and includes the controller 16 and an electric machine 19, which could be a permanent magnet synchronous motor (PMSM), and is hereinafter denoted as electric machine 19. The controller 16 is powered by the vehicle power supply 10 through direct current bus 12. The controller 16 receives a vehicle speed signal 14 representative of the vehicle velocity from a vehicle velocity sensor 17. Steering angle is measured through position sensor 32, which may be an optical encoding type sensor, variable resistance type sensor, or any other suitable type of position sensor, and supplies to the controller 16 a position signal 20. Motor velocity may be measured with a tachometer, or any other device, and transmitted to controller 16 as a motor velocity signal 21. A motor velocity denoted $\omega_m$ may be measured, calculated or a combination thereof. For example, the motor velocity $\omega_m$ may be calculated as the change of the motor position $\theta$ as measured by a position sensor 32, over a prescribed time interval. For example, motor speed $\omega_m$ may be determined as the derivative of the motor position $\theta$ from the equation $\omega_m = \Delta\theta/\Delta t$ where $\Delta t$ is the sampling time and $\Delta\theta$ is the change in position during the sampling interval. Alternatively, motor velocity may be derived from motor position as the rate of change of position with respect to time. It will be appreciated that there are numerous well-known methodologies for performing the function of a derivative.

As the steering wheel 26 is turned, torque sensor 28 senses the torque applied to the steering wheel 26 by the vehicle operator. The torque sensor 28 may include a torsion bar (not shown) and a variable resistive-type sensor (also not shown), which outputs a variable torque signal 18 to controller 16 in relation to the amount of twist on the torsion bar. Although this is one type of torque sensor, any other suitable torque-sensing device used with known signal processing techniques will suffice. In response to the various inputs, the controller sends a command 22 to the electric machine 19, which supplies torque assist to the steering system through worm 47 and worm gear 48, providing torque assist to the vehicle steering.

It should be noted that although the disclosed embodiments are described by way of reference to motor control for electric steering applications, it will be appreciated that such references are illustrative only and the disclosed embodiments may be applied to any motor control application employing an electric motor, e.g., steering, valve control, and the like. Moreover, the references and descriptions herein may apply to many forms of parameter sensors, including, but not limited to torque, position, speed and the like. It should also be noted that reference herein to electric machines including, but not limited to, motors, hereafter, for brevity and simplicity, reference will be made to motors only without limitation.

In the control system 24 as depicted, the controller 16 utilizes the torque, position, and speed, and like, to compute a command(s) to deliver the required output power. Controller 16 is disposed in communication with the various systems and sensors of the motor control system. Controller 16 receives signals from each of the system sensors, quantifies the received information, and provides an output command signal(s) in response thereto, in this instance, for example, to the electric machine 19. Controller 16 is configured to develop the corresponding voltage(s) out of inverter (not shown), which may optionally be incorporated with controller 16 and will be referred to herein as controller 16, such that, when applied to the electric machine 19, the desired torque or position is generated. In one or more examples, the controller 16 operates in a feedback control mode, as a current regulator, to generate the command 22. Alternatively, in one or more examples, the controller 16 operates in a feedforward control mode to generate the command 22. Because these voltages are related to the position and speed of the electric machine 19 and the desired torque, the position and/or speed of the rotor and the torque applied by an operator are determined. A position encoder is connected to the lower steering shaft 51 to detect the angular position θ. The encoder may sense the rotary position based on optical detection, magnetic field variations, or other methodologies. Typical position sensors include potentiometers, resolvers, synchros, encoders, and the like, as well as combinations comprising at least one of the foregoing. The position encoder outputs a position signal 20 indicating the angular position of the lower steering shaft 51 and thereby, that of the electric machine 19.

Desired torque may be determined by one or more torque sensors 28 transmitting torque signals 18 indicative of an applied torque. One or more exemplary embodiments include such a torque sensor 28 and the torque signal(s) 18 therefrom, as may be responsive to a compliant torsion bar, T-bar, spring, or similar apparatus (not shown) configured to provide a response indicative of the torque applied.

In one or more examples, a temperature sensor(s) 23 located at the electric machine 19. Preferably, the temperature sensor 23 is configured to directly measure the temperature of the sensing portion of the electric machine 19. The temperature sensor 23 transmits a temperature signal 25 to the controller 16 to facilitate the processing prescribed herein and compensation. Typical temperature sensors include thermocouples, thermistors, thermostats, and the like, as well as combinations comprising at least one of the foregoing sensors, which when appropriately placed provide a calibratable signal proportional to the particular temperature.

The position signal 20, velocity signal 21, and a torque signal(s) 18 among others, are applied to the controller 16. The controller 16 processes all input signals to generate values corresponding to each of the signals resulting in a rotor position value, a motor speed value, and a torque value being available for the processing in the algorithms as prescribed herein. Measurement signals, such as the above mentioned are also commonly linearized, compensated, and filtered as desired to enhance the characteristics or eliminate undesirable characteristics of the acquired signal. For example, the signals may be linearized to improve processing speed, or to address a large dynamic range of the signal. In addition, frequency or time-based compensation and filtering may be employed to eliminate noise or avoid undesirable spectral characteristics.

In order to perform the prescribed functions and desired processing, as well as the computations therefore (e.g., the identification of motor parameters, control algorithm(s), and the like), controller 16 may include, but not be limited to, a processor(s), computer(s), DSP(s), memory, storage, register(s), timing, interrupt(s), communication interface(s), and input/output signal interfaces, and the like, as well as combinations comprising at least one of the foregoing. For example, controller 16 may include input signal processing and filtering to enable accurate sampling and conversion or acquisitions of such signals from communications interfaces. Additional features of controller 16 and certain processes therein are thoroughly discussed at a later point herein.

Figure 2:
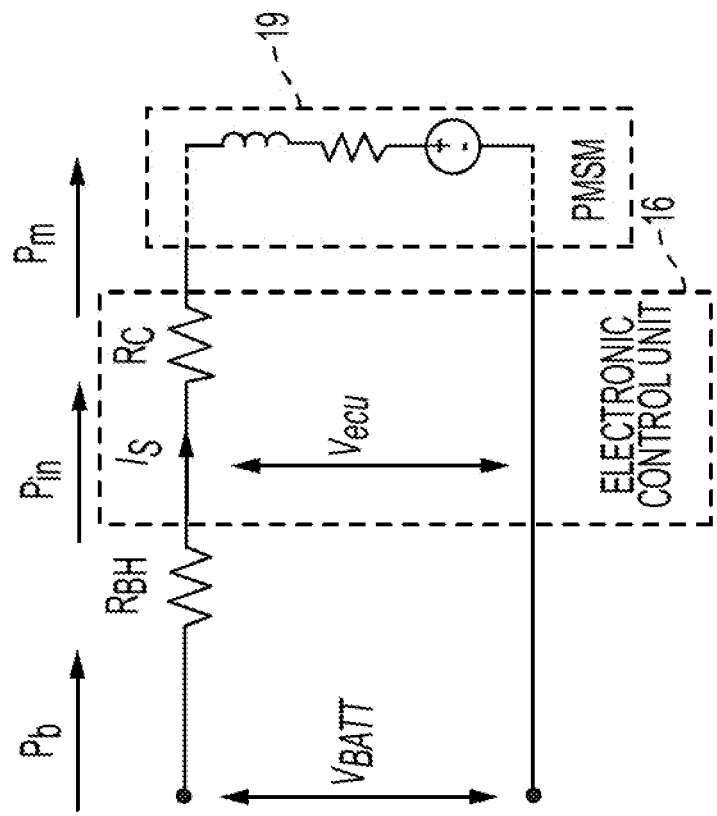
FIG. 2 depicts a power flow of a motor control system according to aspects of the present disclosure.

FIG. 2 depicts a power flow of a motor control system. The motor control system that is depicted is from the steering system 40 including the control module 16 and the electric machine 19, which define a voltage loop that includes the voltage across the battery (not shown) and the voltage at the input of the inverter (not shown) which is then connected to the electric machine 19.

For a given battery voltage ($V_{BATT}$), and a measurement of the supply voltage ($V_{ecu}$) to the controller 16, the power equations may be solved to obtain motor current limits. A voltage circuit model considering the battery may be mathematically expressed as follows.

$$V_{ecu} = V_{BATT} - R_{BH} I_s$$

In the above equation $R_{BH}$ represents the battery harness resistance and $I_s$ represents a battery current from the battery to the control module 16. Positive values of the battery current $I_s$ indicate a supply current draw from the battery 10 to the control module 16. Negative values of the battery current $I_s$ indicate a regenerative current from the control module 16 to the battery 10.

Figure 3:
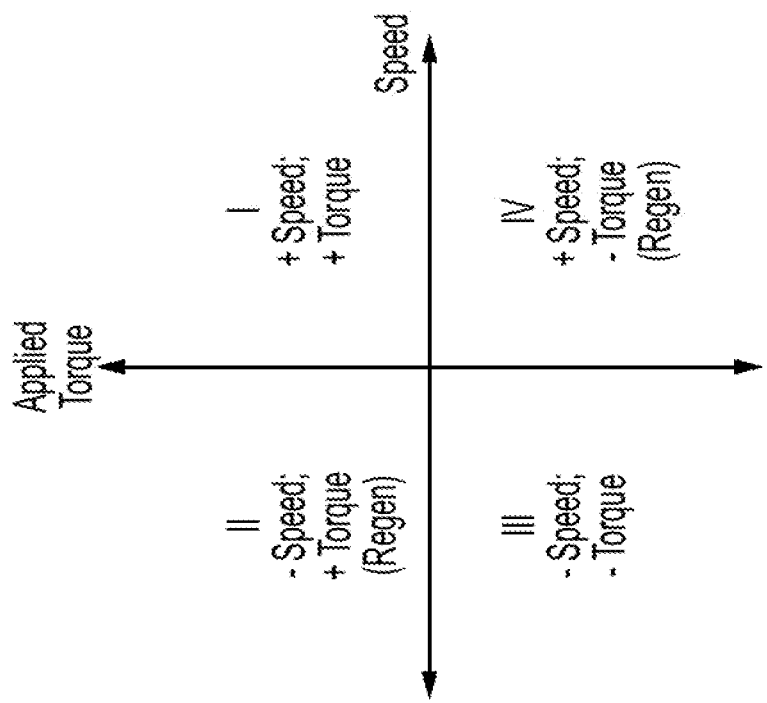
FIG. 3 depicts a graph of applied torque vs. speed of a motor control system according to aspects of the present disclosure.

FIG. 3 depicts a graph of applied torque vs. speed of a motor control system according to aspects of the present disclosure. Specifically, FIG. 3 depicts the graph including four quadrants, with quadrants II and IV each associated with the motor control system being in a regenerative mode.

Figure 4:
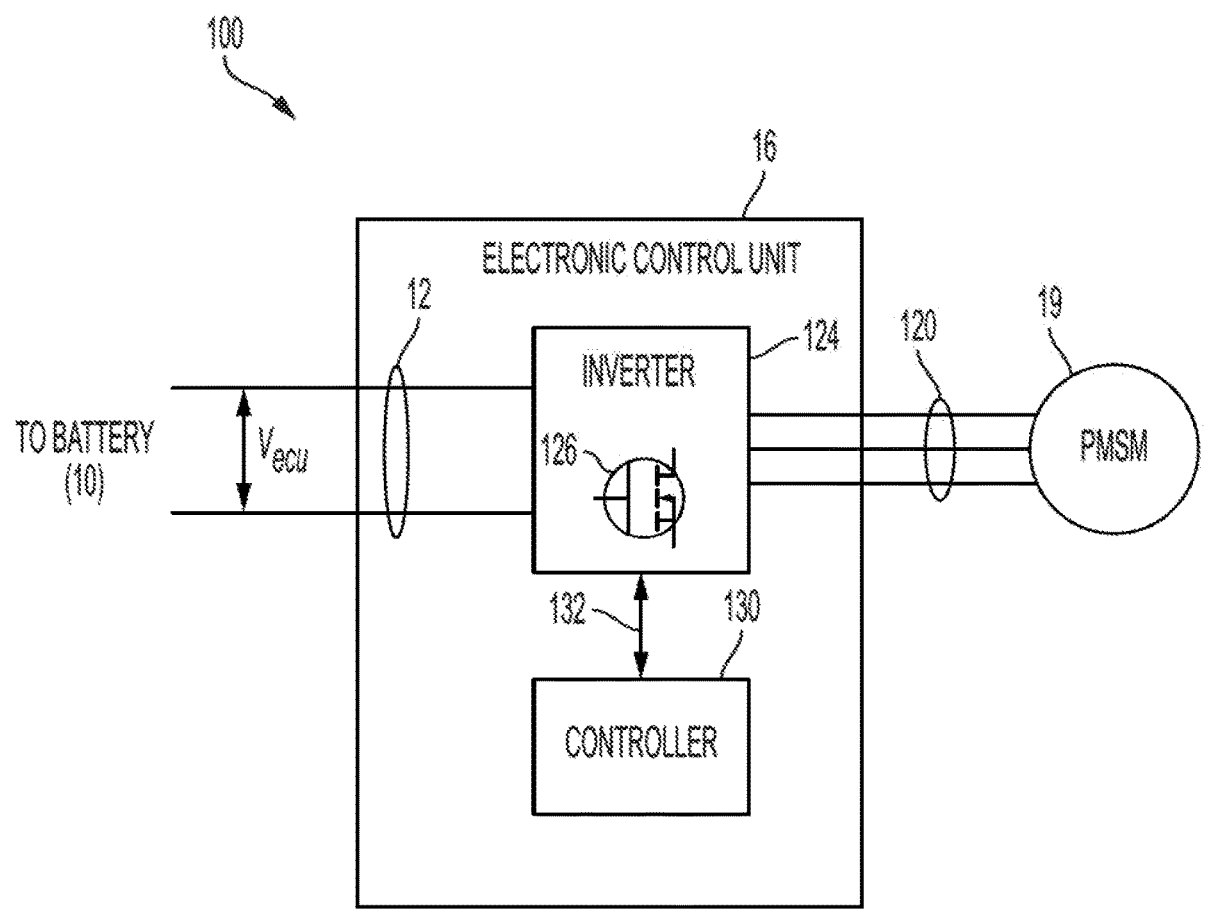
FIG. 4 depicts a block diagram of an example control system for an electric machine according to aspects of the present disclosure.

FIG. 4 depicts a block diagram of an example control system 100 for an electric machine 19 according to aspects of the present disclosure. In some embodiments, and as shown in FIG. 4, electric machine 19 is a permanent magnet synchronous machine (PMSM) type electric motor. However, the electric machine 19 may be another type of motor or motor/generator, such as a wound field machine. In the regenerative mode, power is generated by the electric machine 19 as alternating current upon alternating current phase buses 120 and is converted to a direct current power upon a direct current bus 12 by an inverter 124. The inverter 124 includes a plurality of switches 126, such as field effect transistors (FETs), to rectify current from the alternating current phase buses 120 to the direct current bus 12. In some embodiments, the direct current bus 12 is coupled to a direct current power source, such as the battery 10.

A controller 130 is in communication with the inverter 124 via a communications path 132 for monitoring a plurality of different parameters of the inverter 124 and for controlling operation of the inverter 124 to rectify the alternating current from the alternating current phase buses 120, thus transferring power from the electric machine 19 and causing the electric machine 19 to generate a braking torque. Such operation corresponds to the regenerative mode shown as quadrants II and IV in the graph of applied torque vs. speed on FIG. 3.

Figure 5:
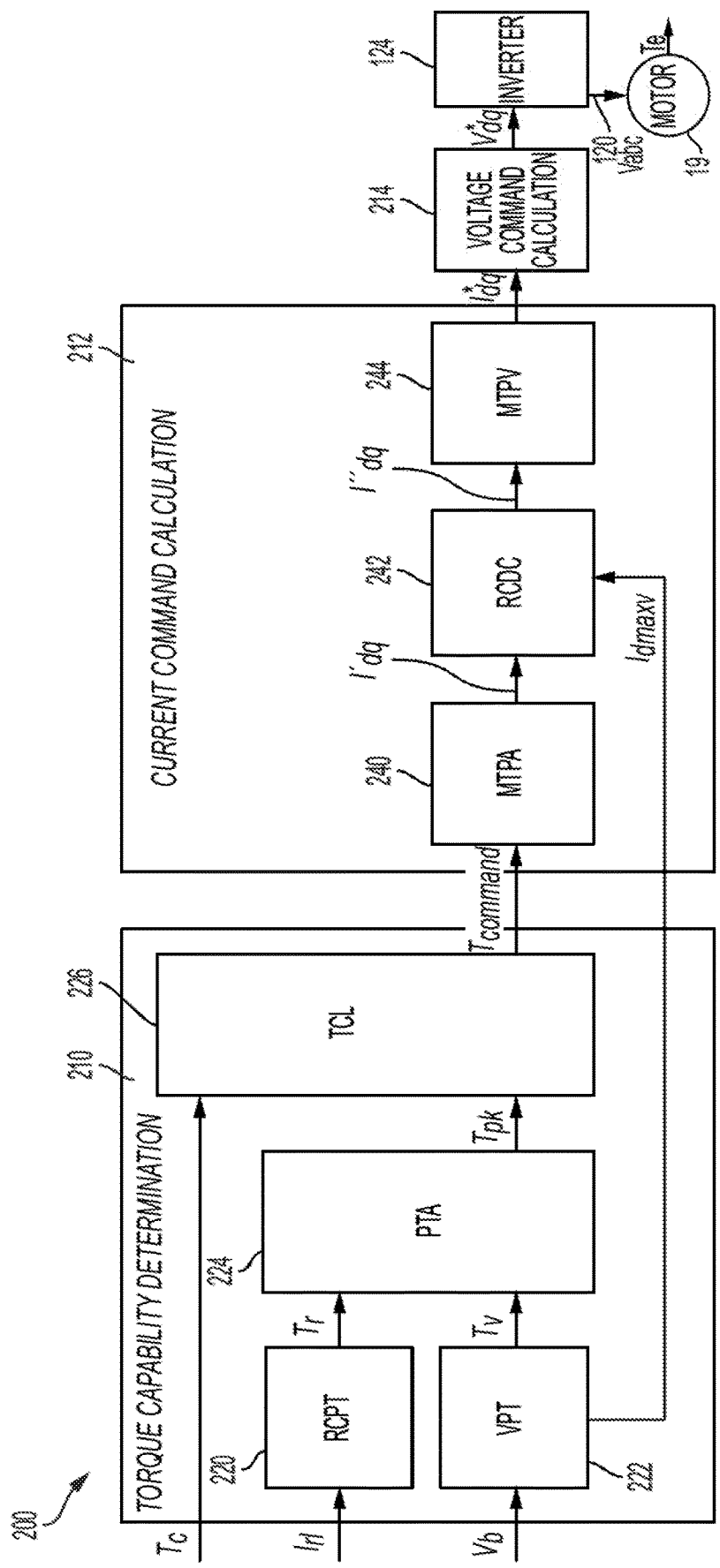
FIG. 5 depicts a block diagram of an example algorithm for controlling regenerative current according to aspects of the present disclosure.

FIG. 5 depicts a block diagram of a first algorithm 200 for controlling regenerative current according to aspects of the present disclosure. The first algorithm 200 may be implemented using hardware, software, or a combination of hardware and software. The first algorithm 200 is implemented by the controller 130 for controlling the inverter 124 to control the regenerative current $I_r$. Specifically, the first algorithm 200 accepts as inputs a torque demand $T_c$, a voltage limit constraint $V_b$, and a regenerative current limit $I_{rl}$. The voltage limit constraint $V_b$ is a maximum voltage value for the direct current bus 12, and the regenerative current limit $I_{rl}$ is a maximum current that the inverter 124 is permitted to provide to the direct current bus 12. Each of the regenerative current limit $I_{rl}$ and the voltage limit constraint $V_b$ of the direct current bus 12 may depend on the characteristics of the battery 10 and/or other aspects of the vehicle power supply system. Either or both of the regenerative current limit $I_{rl}$ and/or the voltage limit constraint $V_b$ may be fixed during operation of the system. Alternatively, either or both of the regenerative current limit $I_{rl}$ and/or the voltage limit constraint $V_b$ may be variable. For example, the regenerative current limit $I_{rl}$ may change with time or with a speed of the electric machine 19. The controller 16 may perform on-the-fly adjustments in order to satisfy both the regenerative current limit $I_{rl}$ and the voltage limit constraint $V_b$. The first algorithm 200 produces as an output, current commands $I^*_{dq}$ for controlling operation of the inverter 124. More specifically, the current commands $I^*_{dq}$ are converted to voltage commands $V^*_{dq}$, which are applied to the inverter 124. The current commands $I^*_{dq}$ comprise d-axis and q-axis components of currents of the electric machine 19.

The first algorithm 200 is divided into two main components, a torque capability determination block 210, and a current command calculation block 212. The first algorithm 200 also includes a voltage command calculation block 214, and the inverter 124. The torque capability determination block 210 generates and supplies a torque command $T_{command}$ and voltage-limited d-axis current $I_{dmaxv}$ to the current command calculation block 212. The torque capability determination block 210 includes a regenerative current peak torque (RCPT) block 220 that is configured to calculate a regenerative current limit-based torque $T_r$ corresponding to the regenerative current limit $I_{rl}$ of the direct current bus 12. The RCPT block 220 computes the regenerative current limit-based torque $T_r$, which is a maximum possible torque that can be generated by the electric machine 19 for the given regenerative current limit $I_{rl}$, as derived below. The total electrical power $P_e$ in terms of the supply voltage $V_{ecu}$, the battery current $I_s$, and the input circuit resistance $R_c$ is as follows.

$$V_{ecu}I_s - R_c I_s^2 = P_e$$

The electrical power in terms of q-axis and d-axis motor current $I_{dq}$ is expressed as follows.

$$P_e = 3/2(RI_d^2 + RI_q^2 + \omega_e((L_q - L_d)I_d + K_e\omega_m)I_q)$$

where $I_d$ is the d-axis current, $I_q$ is the q-axis current, $\omega_e$ is an electrical speed, $K_e$ is a motor voltage constant, $\omega_m$ is a mechanical speed, and $L_q$ and $L_d$ are q-axis and d-axis inductance of the electric machine 19, respectively.

By inspecting the power equation in terms of motor currents, it can be observed that the peak torque for a given regenerative current limit will occur at the maximum allowable d-axis motor current under the given operating conditions. For a given regenerative current limit then, the peak torque is obtained as the root(s) of the following quadratic equation for $I_q$ which is obtained from the above power equations.

$$(3/2R)I_q^2 + 3/2(\omega_e I_d(L_q - L_d) + K_e\omega_m)I_q + (3/2I_d^2 R - V_b I_{rl} + R_c I_{rl}^2) = 0$$

Since the peak torque occurs at maximum d-axis motor current value $I_d$, the above equation is solved by substituting $I_d$ equal to $I_{dmax}$ which is the d-axis current value at which the peak torque considering the voltage limit constraint $V_b$ occurs. Note that in some embodiments, $I_{dmax}$ is representative of a demagnetizing current limit $I_{d\_demag}$ of the electric machine 19 under voltage-limited operation. In other words, currents in excess of the demagnetizing current limit $I_{d\_demag}$ may result in permanent magnets within the electric machine 19 becoming permanently demagnetized. Thus, this value acts as the maximum allowable d-axis current that can be generated under any given operating condition. The solution of the quadratic is given below.

$$I_{q1,2} = \frac{-b_r \pm \sqrt{b_r^2 - 4a_r c_r}}{2a_r}$$

$$a_r = \frac{3}{2}R$$

$$b_r = \frac{3}{2}(\omega_e I_{dmax}(L_q - L_d) + K_e\omega_m)$$

$$c_r = \frac{3}{2}I_{dmax}^2 V_{ecu} I_{rl} + R_c I_{rl}^2$$

where $I_{q1}$ and $I_{q2}$ are either both positive or negative depending on the speed. The lower positive (or negative) value is typically used.

Finally, the peak torque may be computed as follows.

$$\tau_{r1,2} = \frac{3}{2}K_e I_{q1,2} + \frac{3}{2}\frac{N_p}{2}(L_q - L_d)I_{dmax}I_{q1,2}$$

where $N_p$ is the number of poles of the electric machine 19. The peak positive and negative torque values, which occur at the corresponding (same) speed signs, are equal to roots $T_{r1}$ and $T_{r2}$, respectively.

Notice that the existence of the roots is dependent on the following condition.

$$R_v = \sqrt{b_r^2 - 4a_r c_r} \geq 0$$

This condition is actively checked to ensure the existence of a solution. In case a solution does not exist, the regenerative current limit-based (positive and negative) peak torques $T_{rp}$ and $T_{rn}$ may be set to the same value as the voltage based peak torques $T_{vp}$ and $T_{vn}$ respectively (alternatively, the value may be set to an arbitrarily large number such that it is essentially ignored by the subsequent blocks).

The final arbitrated peak torque values $T_{ap}$ and $T_{an}$ may be computed as follows.

$$T_{apn} = \text{sign}(T_{rpn}) \times \max(|T_{rp}|, |T_{vp}|), \text{ where } R_v = \text{True}$$

$$T_{apn} = T_{rvpn}, \text{ where } R_v = \text{False}$$

Note that in some cases additional logic for ensuring that the values of $T_{rp}$ and $T_{rn}$ have the correct sign may also be implemented.

The above algorithm calculates the maximum possible d-axis current to cause the electric machine 19 to produce a regenerative current limit-based torque $T_r$, which is a regenerative (braking) torque that corresponds to the regenerative current limit $I_{rl}$ of the direct current bus, and is thus inherently inefficient. However, for some safety critical applications such as EPS, it is acceptable and even advisable to compromise efficiency because low braking torque under some driving conditions can potentially result in driver injury and even loss of vehicle control. This is especially true when the allowed regenerative current limit is low. However, in some applications, the limit may be large enough or efficiency may be the priority. In such cases, a different approach may be implemented in which efficiency is increased at the cost of peak allowable torque. This may be done, for example, by using zero for the value of $I_d$ in the quadratic equation in $I_q$ for computing the peak regenerative current limit-based torque (described above).

Still referring to FIG. 5, the torque capability determination block 210 also includes a voltage-based peak torque (VPT) block 222 that is configured to calculate a voltage-based torque limit $T_v$ corresponding to the supply voltage $V_{ecu}$ of the direct current bus 12. The torque capability determination block 210 also includes a peak torque arbitration (PTA) block 224 configured to arbitrate the voltage-based torque limit $T_v$, and the regenerative current limit-based torque $T_r$ values in order to determine a torque limit $T_{pk}$. More specifically, the PTA block 224 is configured to calculate the torque limit $T_{pk}$ as a lesser of the regenerative current limit-based torque $T_r$ and the voltage-based torque limit $T_v$. For example, the PTA block 224 is configured to set the torque limit $T_{pk}$ equal to the regenerative current limit-based torque $T_r$ when the regenerative current limit-based torque $T_r$ is less than the voltage-based torque limit $T_v$, and to set the torque limit $T_{pk}$ equal to the voltage-based torque limit $T_v$ when it is less than the regenerative current-based torque limit $T_r$.

The torque capability determination block 210 also includes a torque command limiting (TCL) block 226 configured to generate a torque command $T_{command}$ by clamping the torque demand $T_c$ not to exceed the torque limit $T_{pk}$. In other words, the TCL block 226 is configured to calculate the torque command $T_{command}$ as a lesser one of the torque demand $T_c$ and the torque limit $T_{pk}$.

The current command calculation block 212 of the first algorithm 200, shown on FIG. 5 includes maximum torque per ampere (MTPA) block 240, and a regenerative current based d-axis motor current search (RCDC) block 242, and a maximum torque per voltage (MTPV) block 244. The MTPA block 240 receives the torque command $T_{command}$ from the torque capability determination block 210 and calculates minimum motor current commands that satisfy the torque command $T_{command}$. Those minimum motor currents are then sent to the RCDC block 242, which searches for the optimal value of d-axis current $I_d$ such that the regenerative current limit $I_{rl}$ is satisfied. In some embodiments, the RCDC block 242 increases the d-axis current variable in steps until a corresponding calculated battery current $I_s$ is equal to or within a predetermined tolerance of the regenerative current limit $I_{rl}$. The d-axis current search may include increasing the d-axis current variable from a beginning value $I_{dmin}$. In some embodiments, the beginning value $I_{dmin}$ may be zero.

Note that the search may be done by using any known numerical techniques involving iterative solvers such as, for instance, the bisection method. The search may proceed until a difference between the calculated battery current $I'_s$ and the regenerative current limit $I_{rl}$ comes within an acceptable predetermined tolerance. In some embodiments, a predetermined limit may also be imposed on the number of iterations. In the case where the efficiency is prioritized, the RCDC block 242 may be disabled and essentially acts as a pass-through.

The outputs of the RCDC block 242 are then sent to the MTPV block 244 to ensure that the voltage limit constraint $V_b$ is met, and are then sent as final current commands $I^*_{dq}$ to the voltage command calculation block 214, which generates corresponding voltage commands $V^*_{dq}$. Those voltage commands $V^*_{dq}$ are supplied to the inverter 124, functioning as the inverter 124. The inverter 124, thus, generates output phase voltages $V_{abc}$ upon the alternating current phase buses 120, causing the electric machine 19 to produce a braking torque $T_e$.

Figure 6:
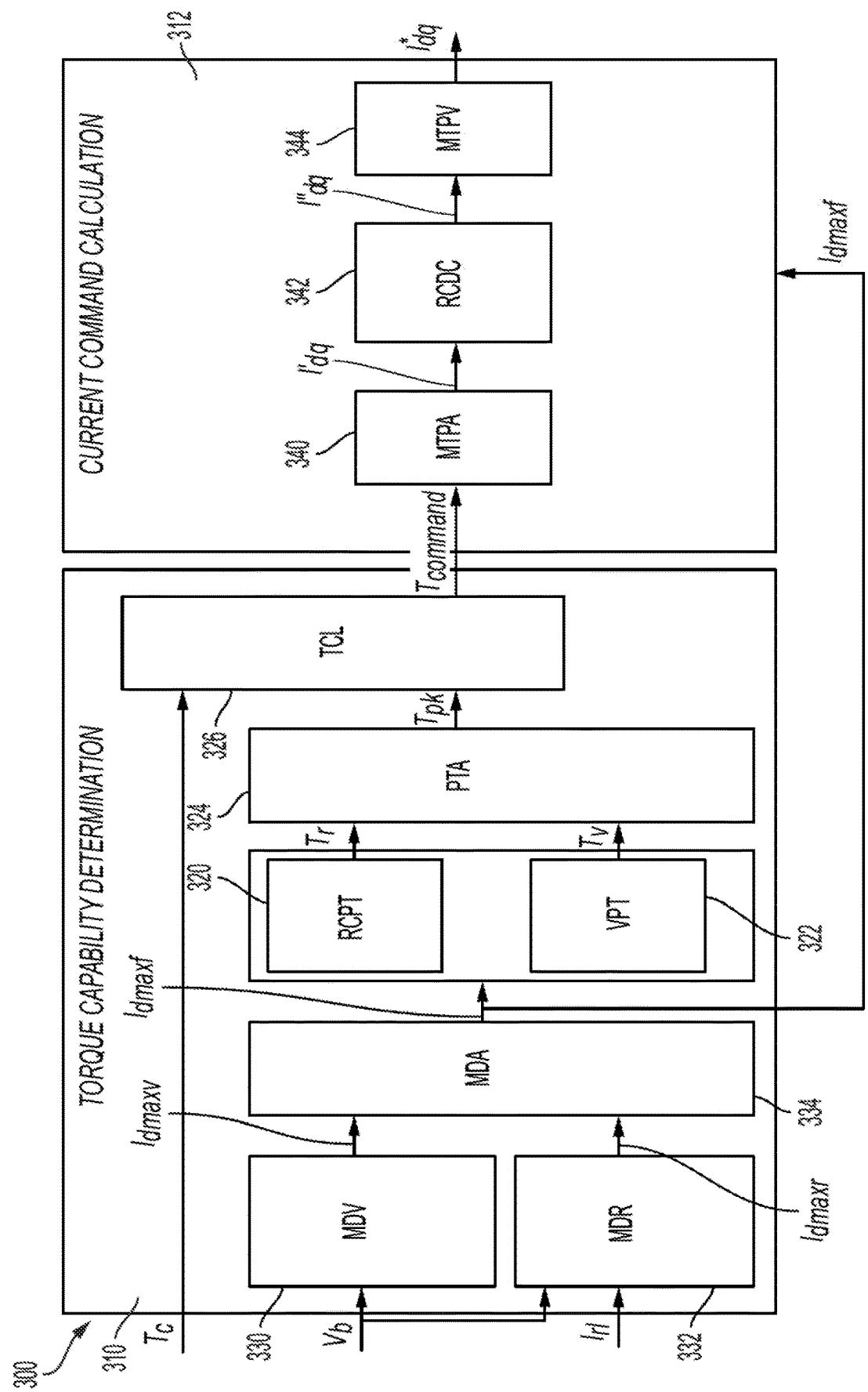
FIG. 6 depicts a block diagram of an example algorithm for controlling regenerative current according to aspects of the present disclosure.

Referring now to FIG. 6, a second algorithm 300 for controlling regenerative current according to aspects of the present disclosure. The second algorithm 300 may be implemented using hardware, software, or a combination of hardware and software. The second algorithm 300 is implemented by the controller 130 for controlling the inverter 124 to control the regenerative current $I_r$. Specifically, the second algorithm 300 accepts as inputs a torque demand $T_c$, a voltage limit constraint $V_b$ of the direct current bus 12, and a regenerative current limit $I_{rl}$ of the direct current bus 12. The second algorithm 300 produces as an output, a current command $I^*_{dq}$ for controlling operation of the inverter 124, which may be performed similarly or identically as in the first algorithm 200, and as shown in FIG. 5. The current command $I^*_{dq}$ comprises a d-axis component and a q-axis component. Each of the regenerative current limit $I_{rl}$ and the voltage limit constraint $V_b$ of the direct current bus 12 may depend on the characteristics of the battery 10 and/or other aspects of the vehicle power supply system. Either or both of the regenerative current limit $I_{rl}$ and/or the voltage limit constraint $V_b$ may be hard coded in hardware or software of the controller 16 or in another device or memory. Additionally or alternatively, either or both of the regenerative current limit $I_{rl}$ and/or the voltage limit constraint $V_b$ may change during operation of the system, based on a given operating condition. In some embodiments, either or both of the regenerative current limit $I_{rl}$ and/or the voltage limit constraint $V_b$ may be determined by the controller 16 based upon a calculation or another means, such as a lookup table. The second algorithm 300 may include aspects or portions that are similar or identical to those described in the first algorithm 200, above.

The second algorithm 300 is divided into two main components, a torque capability determination block 310, and a current command calculation block 312. The torque capability determination block 310 generates and supplies a torque command $T_{command}$ and final d-axis current limit to the current command calculation block 312. The second algorithm 300 includes several blocks that may function similar or identically to corresponding blocks of the first algorithm 200, described above. For example, the torque capability determination block 310 of the second algorithm 300 includes a regenerative current peak torque (RCPT) block 320, that may be similar or identical to the regenerative current peak torque (RCPT) block 220 of the first algorithm 200. The torque capability determination block 310 of the second algorithm 300 also includes a voltage-based peak torque (VPT) block 322 that may be similar or identical to the voltage-based peak torque (VPT) block 222 of the first algorithm 200. The torque capability determination block 310 of the second algorithm 300 also includes a peak torque arbitration (PTA) block 324 that may be similar or identical to the peak torque arbitration (PTA) block 224 of the first algorithm 200. The torque capability determination block 310 of the second algorithm 300 also includes a torque command limiting (TCL) block 326 that may be similar or identical to the torque command limiting (TCL) block 226 of the first algorithm 200.

The current command calculation block 312 of the second algorithm 300, shown on FIG. 6 includes maximum torque per ampere (MTPA) block 340, and a regenerative current based d-axis motor current search (RCDC) block 342, and a maximum torque per voltage (MTPV) block 344. Each of those blocks may be configured similarly or identically to the corresponding blocks 240, 242, 244, respectively, of the first algorithm 200.

The second algorithm 300 also includes several blocks not present in the first algorithm 200, described above. For example, the torque capability determination block 310 of the second algorithm 300 includes a maximum d-axis current for a voltage constraint (MDV) block 330. The torque capability determination block 310 of the second algorithm 300 also includes a maximum d-axis current for a regenerative current constraint (MDR) block 332, and a maximum d-axis current arbitration (MDA) block 334.

The RCPT block 320 is configured to calculate a regenerative current limit-based torque $T_r$ corresponding to the regenerative current limit $I_{rl}$ of the direct current bus 12. The RCPT block 320 computes the regenerative current-based torque limit $T_r$, which is a maximum possible torque that can be generated by the electric machine 19 for the given regenerative current limit $I_{rl}$, as derived below. The total electrical power $P_e$ in terms of the supply voltage $V_{ecu}$, the battery current $I_s$, and the input circuit resistance $R_c$ is as follows.

$$V_{ecu}I_s - R_c I_s^2 = P_e$$

The electrical power in terms of q-axis and d-axis motor currents $I_{dq}$ is expressed as follows.

$$P_e = a^2 R I_d^2 + a^2 R I_q^2 + a K_e \omega_m I_q + a^2 \omega_e (L_q - L_d) I_d I_q$$

In the above equations "a" represents $\sqrt{3}/2$, a conversion factor when line parameters are used. By inspecting the power equation in terms of motor currents, we can see that the peak torque at the regenerative current limit $I_{rl}$, occurs at the maximum possible d-axis motor current value. Using above two equations, we can derive the following equation:

$$V_{ecu}I_s - R_c I_s^2 = a^2 R I_d^2 + a^2 R I_q^2 + a K_e \omega_m I_q + a^2 \omega_e (L_q - L_d) I_d I_q$$

In order to calculate the peak q-axis current $I_q$ for the regenerative current limit $I_{rl}$, the above equation is written as follows.

$$(a^2 R) I_q^2 + (a^2 \omega_e (L_q - L_d) I_d + a K_e \omega_m) I_q + (a^2 R I_d^2 - V_{ecu} I_{rl} + R_c I_{rl}^2) = 0$$

The above equation is a quadratic equation in terms of $I_q$, which can be solved to obtain two roots. As the peak torque for the regenerative current limit $I_{rl}$ occurs at maximum d-axis motor current value, we substitute in the above equation with the D-axis current calculated from the maximum D-axis current arbitration (MDA) block 334.

The MDA block 334 generates a final maximum d-axis current $I_{dmaxf}$ by arbitrating between a voltage-based maximum d-axis current $I_{dmaxv}$ from the MDV block 330 and a regenerative current limit-based maximum d-axis current $I_{dmaxr}$ from the MDR block 332. The voltage-based maximum d-axis current $I_{dmaxv}$ is a voltage-dependent peak d-axis current $I_d$ value where peak torque occurs at a given supply voltage $V_{ecu}$. In some embodiments, this $I_{dmaxv}$ is representative of the demagnetizing current limit $I_{d\_demag}$. For PMSM type electric machines 19, the demagnetization current limit $I_{d\_demag}$ is equal to $4K_e/(\sqrt{3} L_d N_p)$, where $K_e$ is a back electromagnetic force constant, $L_d$ is a d-axis inductance of the electric machine 19, and $N_p$ is a number of poles of the electric machine 19. In some embodiments, the regenerative current limit-based maximum d-axis current $I_{dmaxr}$ is greater than the demagnetizing current limit $I_{d\_demag}$. The arbitration between $I_{dmaxr}$ and $I_{dmaxv}$ is done to maximize available torque under all operating conditions. The second algorithm 300 also maximizes the torque to ensure stability during the dynamic braking events where the motor speed may become very high due to external impulse events, such as wheels of the vehicle hitting a curb.

The MDR block 332 is configured to calculate the regenerative current limit-based maximum d-axis current $I_{dmaxr}$ as follows. The regenerative current limit-based maximum d-axis current $I_{dmaxr}$ is calculated in one of two different ways, depending on whether (or not) the regenerative current limit-based torque $T_r$ is less than the voltage-based torque limit $T_v$ when the d-axis current $I_d$ is swept. These two situations are illustrated graphically in FIGS. 12, and 13, respectively.

From the power equation, for a given regenerative current limit $I_{rl}$, we can write:

$$(a^2 R) I_q^2 + (a^2 \omega_e (L_q - L_d) I_d + a K_e \omega_m) I_q + (a^2 R I_d^2 - V_{ecu} I_{rl} + R_c I_{rl}^2) = 0$$

The discriminant of the above equation can be written as follows:

$$B_{ldp}^2 - 4A_{ldp}C_{ldp} = (a^2 \omega_e (L_q - L_d) I_d + a K_e \omega_m)^2 - 4a^2 R(a^2 R I_d^2 - V_{ecu} I_{rl} + R_c I_{rl}^2)$$

By setting the discriminant equal to zero, and solving for $I_d$, a peak d-axis current $I_{dp}$ that corresponds to the quadrature-axis current $I_q$ having a real solution can be determined. This peak d-axis current $I_{dp}$ is referred to hereafter as the absolute maximum regenerative current limit based d-axis current value.

$$(a^2 \omega_e (L_q - L_d) I_d + a K_e \omega_m)^2 - 4a^2 R(a^2 R I_d^2 - V_{ecu} I_{rl} + R_c I_{rl}^2) = 0$$

Writing the discriminant in the form of quadratic equation to solve for $I_d$ $$(a^4 \omega_e^2 (L_q - L_d)^2 - 4a^4 R^2) I_d^2 + (2a^3 \omega_e \omega_m (L_q - L_d) K_e) I_d + (a^2 K_e^2 \omega_m^2 - 4a^2 R I_{rl}^2 R_c + 4a^2 R V_{ecu} I_{rl}) = 0$$

Solving the above quadratic equation gives two roots and we always take positive value of $I_d$ ($I_d$ positive is considered field weakening according to the dq convention used here) for our control purposes.

$$A_{ldp} = a^4 \omega_e^2 (L_q - L_d)^2 - 4a^4 R^2$$

$$B_{ldp} = 2a^3 \omega_e \omega_m (L_q - L_d) K_e$$

$$C_{ldp} = a^2 K_e^2 \omega_m^2 - 4a^2 R I_{rl}^2 R_c + 4a^2 R V_{ecu} I_{rl}$$

$$I_d = I_{dp} = \frac{-B_{ldp} - \sqrt{B_{ldp}^2 - 4A_{ldp}C_{ldp}}}{2A_{ldp}}$$

Substituting the peak d-axis current $I_{dp}$ in the power equation and solving for a peak q-axis current $I_{qp}$ and corresponding torque $T_{rlp}$:

$$(a^2R)I_q^2 + (a^2\omega_e(L_q - L_d)I_{dp} + aK_e\omega_m)I_q + (a^2RI_{dp}^2 - V_{ecu}I_{rl} + R_cI_{rl}^2) = 0$$

$$A_{lqp} = a^2R$$

$$B_{lqp} = a^2\omega_e(L_q - L_d)I_{dp} + aK_e\omega_m$$

$$C_{lqp} = a^2RI_{dp}^2 - V_{ecu}I_{rl} + R_cJ_{rl}^2$$

$$I_{qp} = \frac{-B_{lqp} \mp \sqrt{B_{lqp}^2 - 4A_{lqp}C_{lqp}}}{2A_{lqp}}$$

(Use "−" for positive torque command and vice-versa)

The RCPT block 320, thus calculates the regenerative current limit-based torque $T_r$ as the peak torque based on the obtained $I_{dp}$ and $I_{qp}$, $$T_r = aK_eI_{qp} + \frac{3}{2}\frac{N_p}{2}\frac{1}{2}(L_q - L_a)I_{qp}I_{dp}$$

Now, substituting $I_{dp}$ in voltage equation and compute $I_{qv}$ and corresponding torque $T_r$:

$$(a^2\omega_e^2L_q^2 + a^2R^2)I_q^2 + (2aRK_e\omega_m + 2a^2R\omega_e(L_q - L_d)I_d)I_q +$$
$$(a^2R^2I_d^2 + K_e^2\omega_m^2 + a^2\omega_e^2L_d^2I_d^2 - 2aK_e\omega_m\omega_eL_dI_d - V_{ecu}^2) = 0$$

$$A_{lqv} = a^2\omega_e^2L_q^2 + a^2R^2$$

$$B_{lqv} = aRK_e\omega_m + 2a^2R\omega_e(L_q - L_a)I_{dp}$$

$$C_{lqv} = a^2R^2I_{dp}^2 + K_e^2\omega_m^2 + a^2\omega_e^2L_d^2I_{dp}^2 - 2aK_e\omega_m\omega_eL_dI_{dp} - V_{ecu}^2$$

$$I_{qv} = \frac{-B_{lqv} \pm \sqrt{B_{lqv}^2 - 4A_{lqv}C_{lqv}}}{2A_{lqv}}$$

(Use "+" for positive torque command and vice-versa)

The VPT block 322, thus calculates the voltage-based torque limit $T_v$ as the peak torque based on the obtained $I_{dp}$ and $I_{qv}$, $$T_v = aK_eI_{qv} + \frac{3}{2}\frac{N_p}{2}\frac{1}{2}(L_q - L_d)I_{qv}I_{dp}$$

The MDR block 332 calculates the current-limited d-axis current $I_{dmaxr}$ to satisfy the regenerative current limit $I_{rl}$ of the direct current bus 12 in accordance with $$Id_{maxr} = \begin{cases} I_{dp}, & T_{rp} < T_{rv} \text{ and } \omega_n < 0 \text{ (or) } T_{rp} \geq T_{rv} \text{ and } \omega_m > 0 \\ I_{ditr} \end{cases}$$

In short, the current-limited d-axis current $I_{dmaxr}$ is assigned the value of $I_{dp}$ in all cases except when the system is operating in regenerative mode (quadrants II, IV of FIG. 3) and when the output torque $T_e$ is limited to the regenerative current-based torque limit $T_r$. When the system is operating in the regenerative mode, and when the output torque $T_e$ is limited to the regenerative current-based torque limit $T_r$, then the current-limited d-axis current $I_{dmaxr}$ is calculated using an iterative solver. An iterative solver output d-axis current $I_{ditr}$ is obtained using an iterative solver by sweeping $I_d$ and solving for $I_q$ which satisfies both the voltage equation and power equation for the regenerative current limit $I_{rl}$.

The maximum and minimum values of $I_d$ that are used in the sweep are obtained by setting $I_q=0$ in voltage equation. This is shown as follows.

$$(a^2R^2 + a^2\omega_e^2L_d^2)I_d^2 - (2aK_e\omega_m\omega_eL_d)I_d + (K_e^2\omega_m^2 - V_{ecu}^2) = 0$$

$$A_{Idmm} = a^2R^2 + a^2\omega_e^2L_d^2$$

$$B_{Idmm} = -(2aK_e\omega_m\omega_eL_d)$$

$$C_{Idmm} = K_e^2\omega_m^2 - V_{ecu}^2$$

Solving above quadratic equation, $$I_{dmm} = \frac{-B_{Idmm} \pm \sqrt{B_{Idmm}^2 - 4A_{Idmm}C_{Idmm}}}{2A_{Idmm}}$$

(use "+" for maximum $I_d$ and "+" for minimum $I_d$)

The MDA block 334 calculates the final maximum d-axis current $I_{dmaxf}$ as follows:

$$Id_{maxf} = \begin{cases} Id_{maxv}, & T_c \geq 0 \text{ and } \omega_m \geq 0 \text{ (or) } T_c < 0 \text{ and } \omega_m < 0 \\ \max(Id_{maxv}, Id_{maxr}) \end{cases}$$

In other words, the MDA block 334 sets the final maximum d-axis current $I_{dmaxf}$ to the value of the voltage-based maximum d-axis current $I_{dmaxr}$ when the system is operating in one of the first or third quadrants (i.e. when the system is taking power from the DC bus). In other cases (i.e. when the system is operating in one of the second or fourth quadrants), the MDA block 334 sets the final maximum d-axis current $I_{dmaxf}$ to the highest of the voltage-based maximum d-axis current $I_{dmaxv}$ and the regenerative current limit-based maximum d-axis current $I_{dmaxr}$.

The final maximum d-axis current $I_{dmaxf}$ is used by the RCPT block 320 and the VPT block 322 to calculate the regenerative current limit-based torque $T_r$, and the voltage-based torque limit $T_v$, respectively. The regenerative current limit-based torque $T_r$, and the voltage-based torque limit $T_v$ are further arbitrated by the PTA block 324 to send out the final peak torque $T_{pk}$ which meets all the constraints. This final peak torque $T_{pk}$ is limited with the motor torque demand $T_c$ by the TCL block 326, which produces a limited torque command $T_{command}$, which is communicated to the current command calculation block 312, which may function similarly or identically to the current command calculation block 212 of the first algorithm 200.

Figure 7:
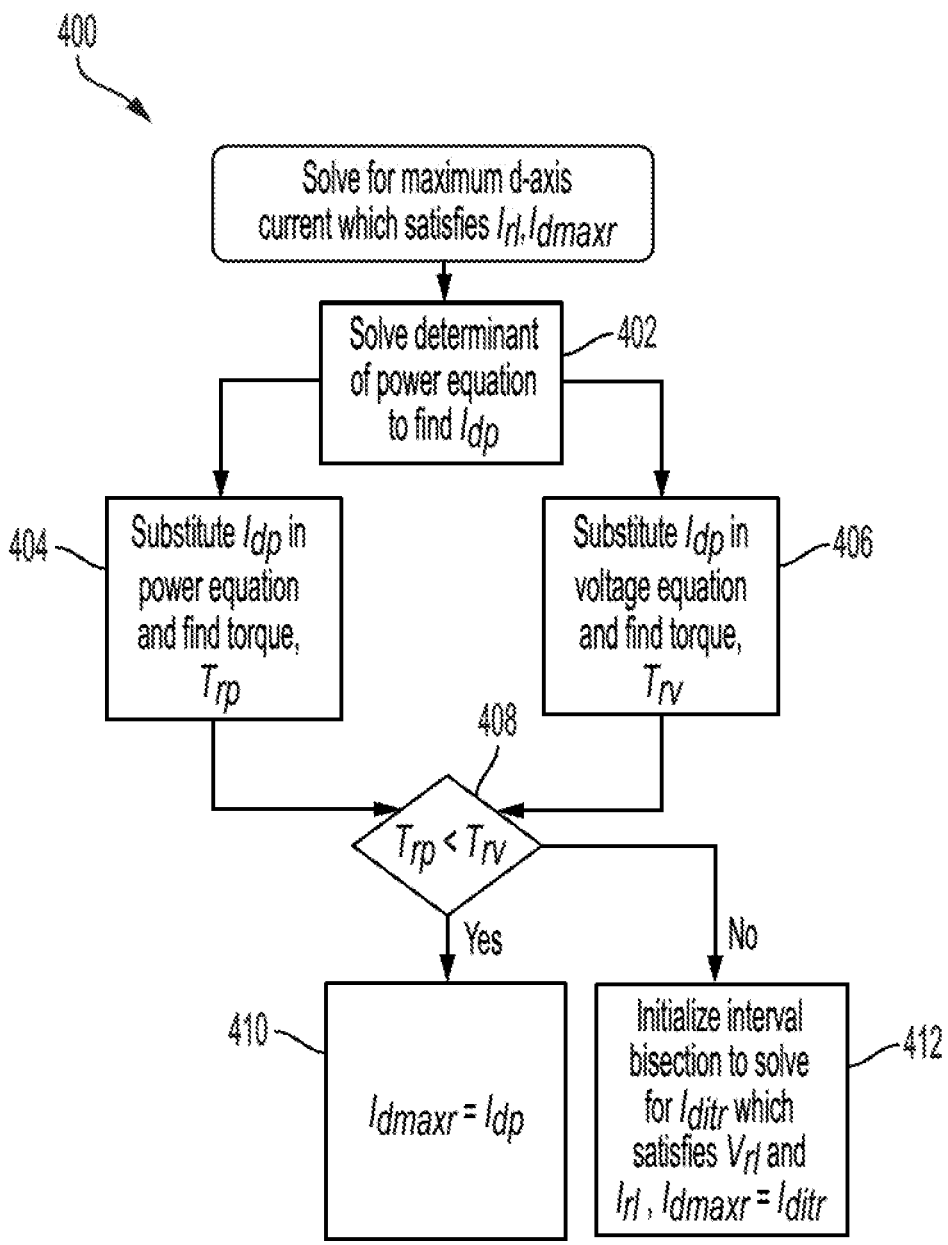
FIG. 7 depicts a flow diagram for calculating a maximum d-axis current to provide a battery current that satisfies a regenerative current limit.

FIG. 7 depicts a flow diagram of a method 400 for calculating a regenerative current limit-based maximum d-axis current $I_{dmaxr}$, which is a highest value for d-axis current that can be produced while the battery current $I_s$ satisfies the regenerative current limit $I_{rl}$. The method 400 shown in the flow diagram of FIG. 7 are performed by the MDR block 332.

The method 400 includes solving the discriminant of the power equation to find a peak d-axis current $I_{dp}$ corresponding to the inverter 124 providing a battery current $I_s$ to the direct current bus 12 which satisfies the regenerative current limit $I_{rl}$ of the direct current bus 12 at step 402. In other words, the peak d-axis current $I_{dp}$ is a d-axis current that causes the inverter 124 to provide battery current $I_s$ to the direct current bus 12 which is less than or equal to the regenerative current limit $I_{rl}$.

The method 400 also includes substituting the peak d-axis current $I_{dp}$ in the power equation to find a corresponding regenerative current limit-based torque $T_{rp}$ at step 404. This step 404 may be performed using the RCPT block 320 or a similar algorithm or calculator, using the peak d-axis current $I_{dp}$ obtained at step 402.

The method 400 also includes substituting the peak d-axis current $I_{dp}$ in the voltage equation to find a corresponding peak voltage-based torque limit $T_{rv}$ corresponding to the voltage limit constraint $V_b$ of the direct current bus 12 at step 406. This step 406 may be performed using the VPT block 322 or a similar algorithm or calculator, using the peak d-axis current $I_{dp}$ obtained at step 402.

The method 400 proceeds with comparing the regenerative current limit-based torque $T_{rp}$ obtained at step 404 with the peak voltage-based torque limit $T_{rv}$ obtained at step 406 to determine if the regenerative current limit-based torque $T_{rp}$ is less than the peak voltage-based torque limit $T_{rv}$ at step 408. A "yes" result of this comparison indicates that the regenerative torque that can be produced by the electric machine 19 is not limited by the voltage limit constraint $V_b$ of the direct current bus 12. In such case, the maximum d-axis current $I_{dmaxr}$ is set to the peak d-axis current $I_{dp}$ at step 410. A "no" result of the comparison at step 408 indicates that the regenerative torque that can be produced by the electric machine 19 is limited by the voltage limit constraint $V_b$ of the direct current bus 12 regenerative current limit $I_{rl}$ of the direct current bus 12. In such case, the maximum d-axis current $I_{dmaxr}$ is determined to satisfy both the voltage limit constraint $V_b$ and the regenerative current limit $I_{rl}$ at step 412. In some example embodiments, step 412 determines the maximum d-axis current $I_{dmaxr}$ using an iterative solver to determine an output d-axis current $I_{ditr}$ that satisfies both the voltage limit constraint $V_b$ and the regenerative current limit $I_{rl}$.

Figure 9:
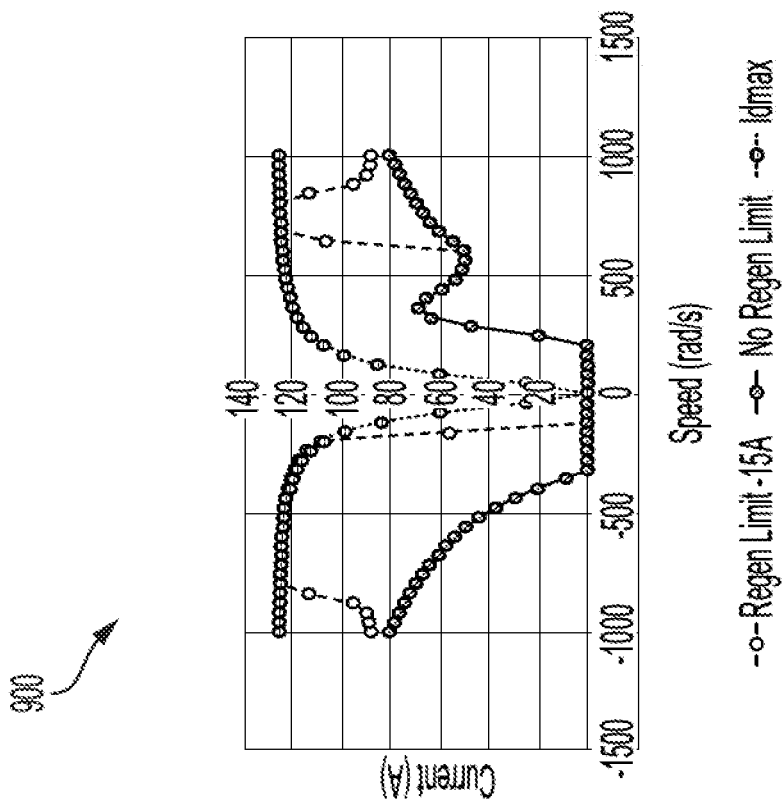
FIG. 9 depicts a graph of d-axis current of an example motor control system according to aspects of the present disclosure.
Figure 8:
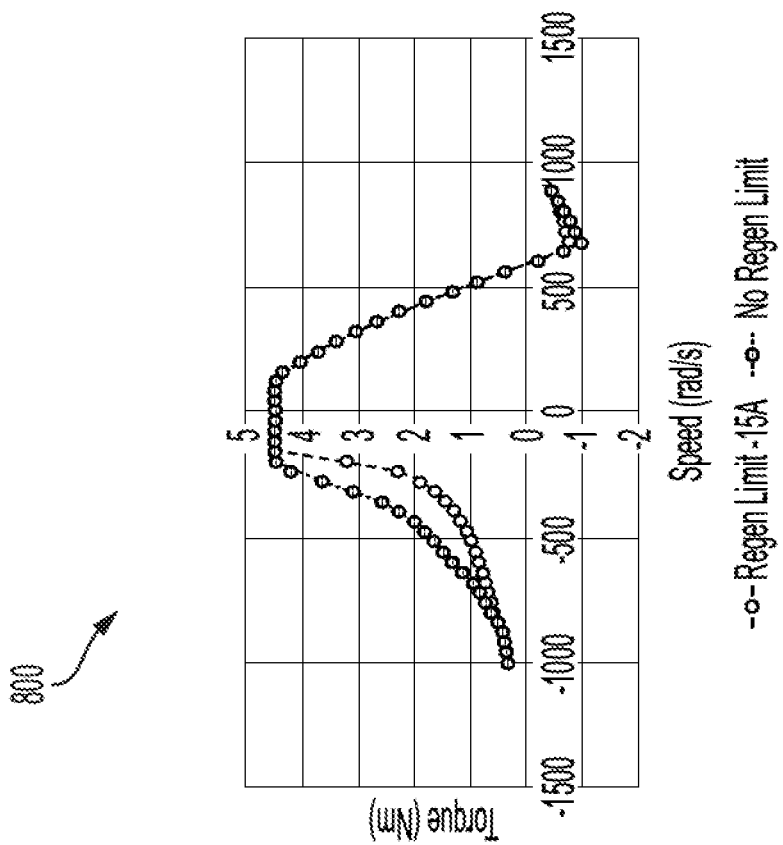
FIG. 8 depicts a graph of torque capability of an example motor control system according to aspects of the present disclosure.

FIG. 8 depicts a graph of torque capability of an example motor control system according to aspects of the present disclosure. FIG. 9 depicts a graph of d-axis current of an example motor control system according to aspects of the present disclosure.

Figure 11:
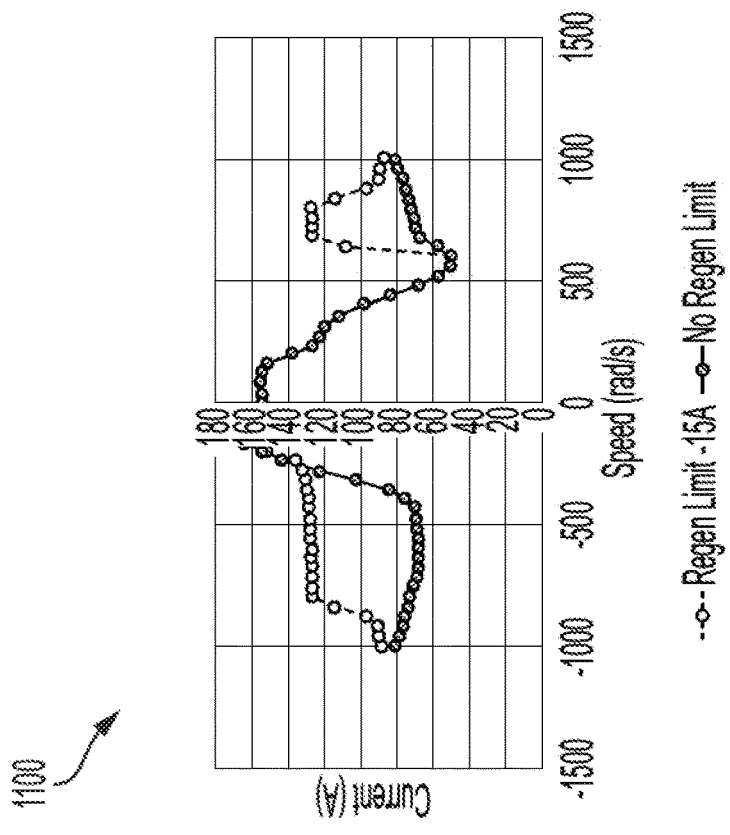
FIG. 11 depicts a graph of motor current of an example motor control system according to aspects of the present disclosure.
Figure 10:
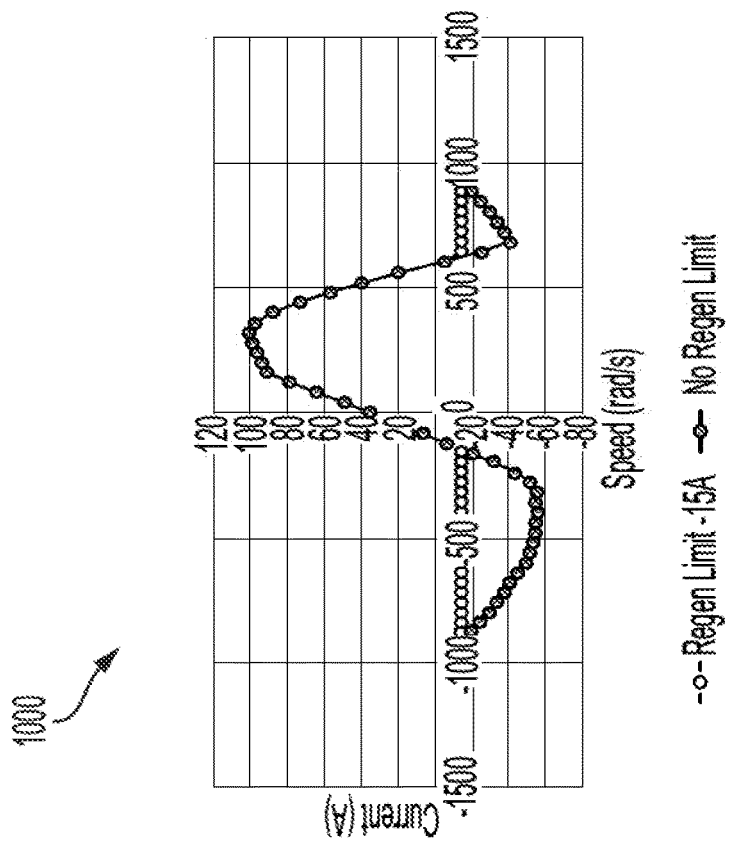
FIG. 10 depicts a graph of battery current of an example motor control system according to aspects of the present disclosure.

FIGS. 10-19 show graphs of various characteristics of example motor control systems according to aspects of the present disclosure and compared with conventional designs. FIG. 10 depicts a graph 1000 of battery current $I_s$ drawn from the direct current bus 12 or supplied by the inverter 124 to the direct current bus 12, with one line showing the system with a regenerative current limit $I_{rl}$ of −15 A, and with another line showing the system with no regenerative current limit $I_{rl}$. FIG. 11 depicts a graph 1100 of motor current of an example motor control system according to aspects of the present disclosure.

Figure 13:
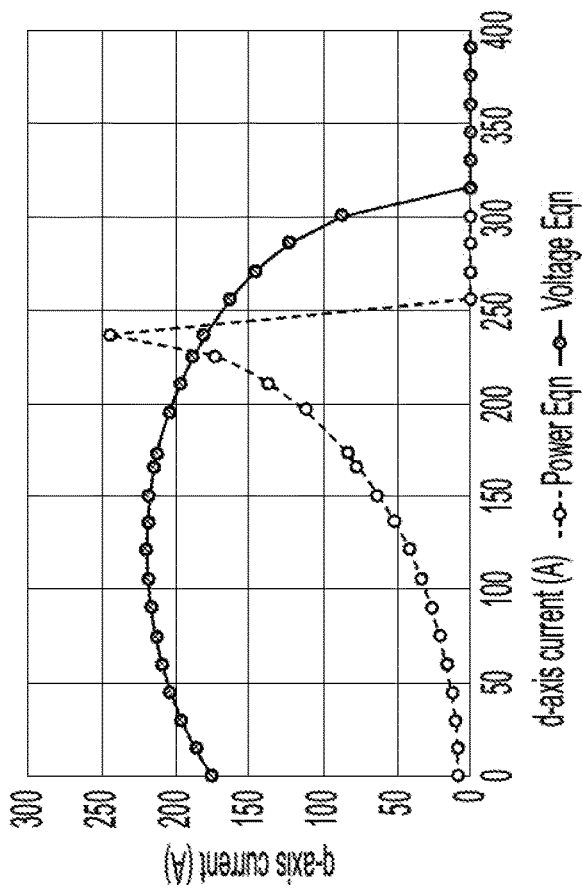
FIG. 13 depicts a graph of q-axis current vs. d-axis current of an example motor control system according to aspects of the present disclosure.
Figure 12:
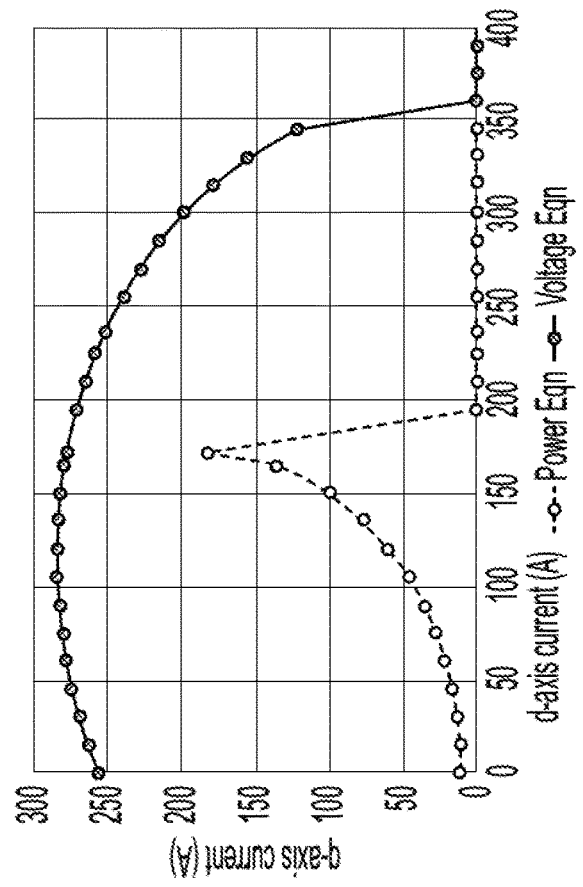
FIG. 12 depicts a graph of q-axis current vs. d-axis current of an example motor control system according to aspects of the present disclosure.

FIG. 12 depicts a graph 1200 of q-axis current vs. d-axis current of an example motor control system according to aspects of the present disclosure. Specifically, graph 1200 includes plot of q-axis current calculated by the power equation (i.e. q-axis current to satisfy the regenerative current limit $I_{rl}$) and which remains less than a plot of q-axis current calculated by the voltage equation (i.e. q-axis current to satisfy the voltage limit constraint $V_b$). FIG. 13 depicts a graph 1300 of q-axis current vs. d-axis current of an example motor control system according to aspects of the present disclosure. The plots of graph 1300 are similar to those in graph 1200, except the plot of q-axis current calculated by the power equation (i.e. q-axis current to satisfy the regenerative current limit $I_{rl}$) exceeds the value of the plot of q-axis current calculated by the voltage equation (i.e. q-axis current to satisfy the voltage limit constraint $V_b$) at some points. FIGS. 12, and 13 represent two different scenarios used by the MDR block 332 to calculate the regenerative current limit-based maximum d-axis current $I_{dmaxr}$.

Figure 14:
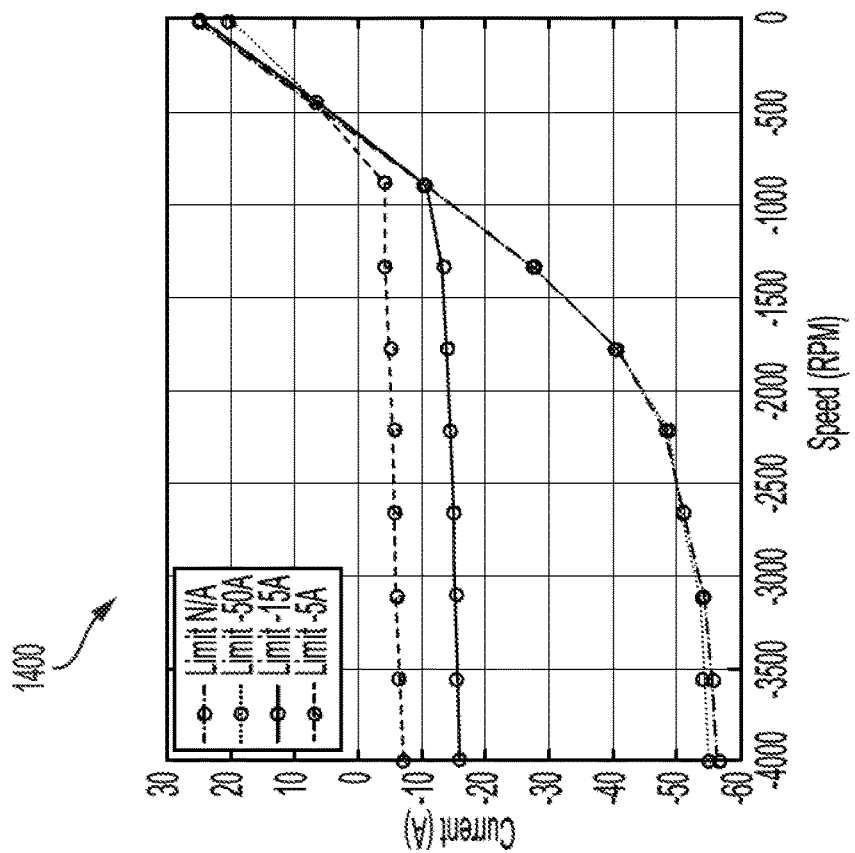
FIG. 14 depicts a graph of battery current vs. speed of an example motor control system according to aspects of the present disclosure.

FIG. 14 depicts a graph 1400 of battery current $I_s$ vs. speed (RPM) of an example motor control system according to aspects of the present disclosure. Specifically, graph 1400 includes lines showing different battery currents $I_s$ when the system has regenerative current limits $I_{rl}$ of −50 A, −15 A, and −5 A, and when the system has no regenerative current limit $I_{rl}$ (which may also be implemented by setting the regenerative current limit $I_{rl}$ very high).

Figure 15:
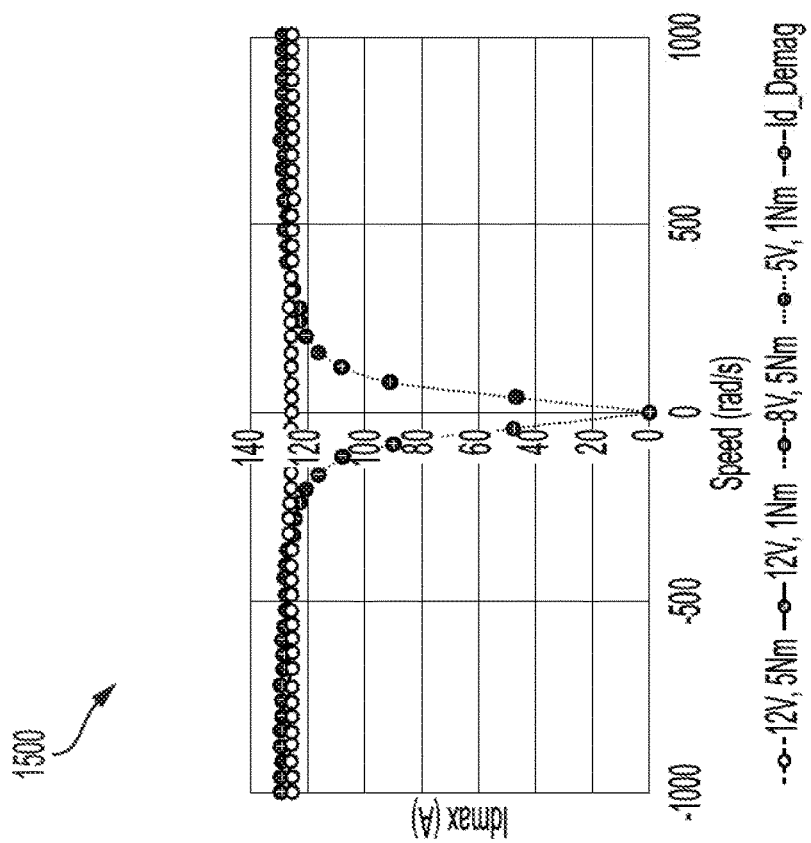
FIG. 15 depicts a graph of maximum d-axis currents of an example motor control system according to aspects of the present disclosure.

FIG. 15 depicts a graph 1500 of maximum d-axis currents $I_{dmax}$ of an example motor control system according to aspects of the present disclosure. Specifically, graph 1500 shows plots of maximum d-axis currents $I_{dmax}$ to satisfy the demagnetization current limit $I_{d\_demag}$ of the electric machine 19 and to operate the electric machine 19 at various supply voltages and torques (given in Newton Meters, Nm), including: 12V and 5 Nm, 12V and 1 Nm, and 5V and 1 Nm.

Figure 17:
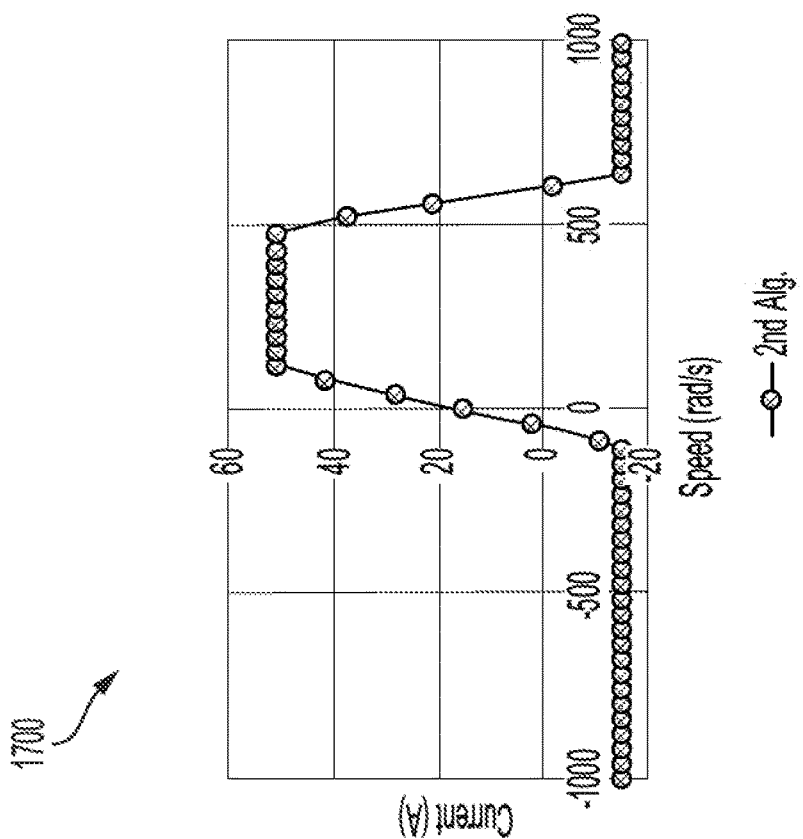
FIG. 17 depicts a graph of battery current of an example motor control system according to aspects of the present disclosure.
Figure 16:
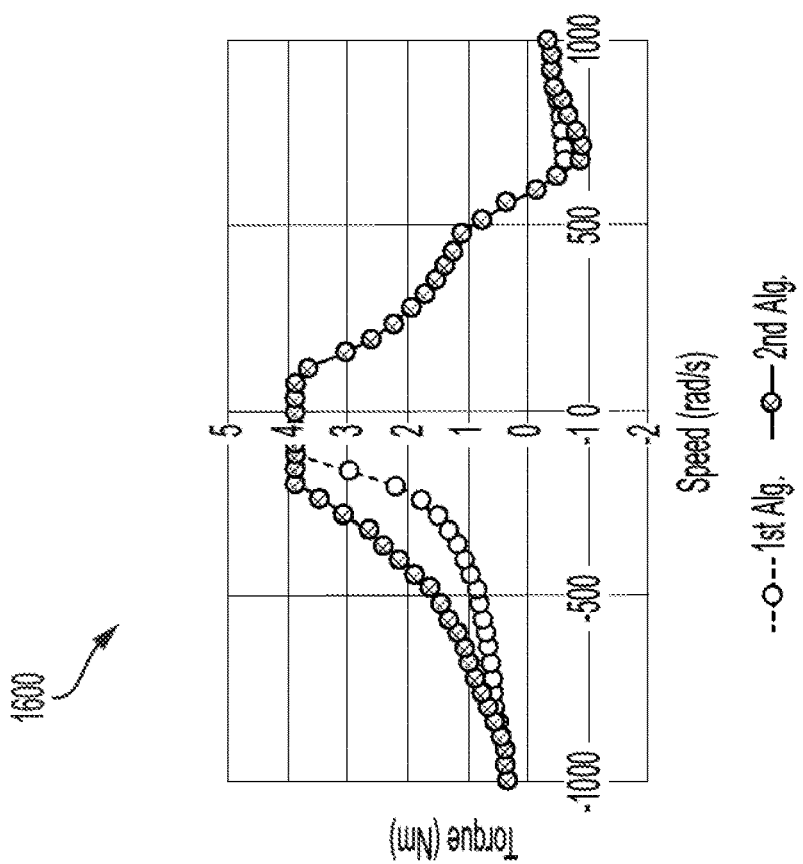
FIG. 16 depicts a graph of torque capability of an example motor control system according to aspects of the present disclosure.

FIG. 16 depicts a graph 1600 of torque capability of an example motor control system according to aspects of the present disclosure. FIG. 16 includes a plot of torque produced by an electric machine 19 at different speeds with the inverter 124 using the first algorithm 200 of the present disclosure ("1st Alg."), and using the second algorithm 300 of the present disclosure ("2nd Alg."). FIG. 17 depicts a graph 1700 of battery current $I_s$ of an example motor control system using the second algorithm 300 of the present disclosure ("2nd Alg."). Specifically, graph 1700 includes a plot of battery current $I_s$ between the direct current bus 12 and a controller 16 operated using the second algorithm 300. In some embodiments, the battery current $I_s$ shown in FIG. 17 may be identical to those produced and/or consumed using the first algorithm 200 and/or to those produced and/or consumed using a conventional control method.

Figure 19:
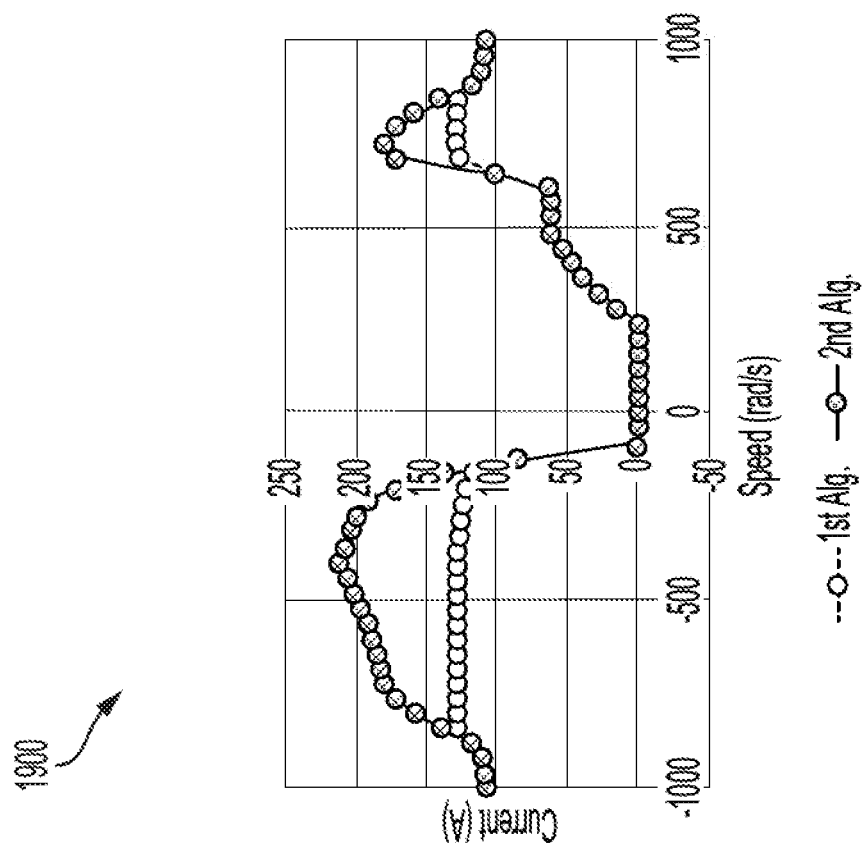
FIG. 19 depicts a graph of d-axis current of an example motor control system according to aspects of the present disclosure.
Figure 18:
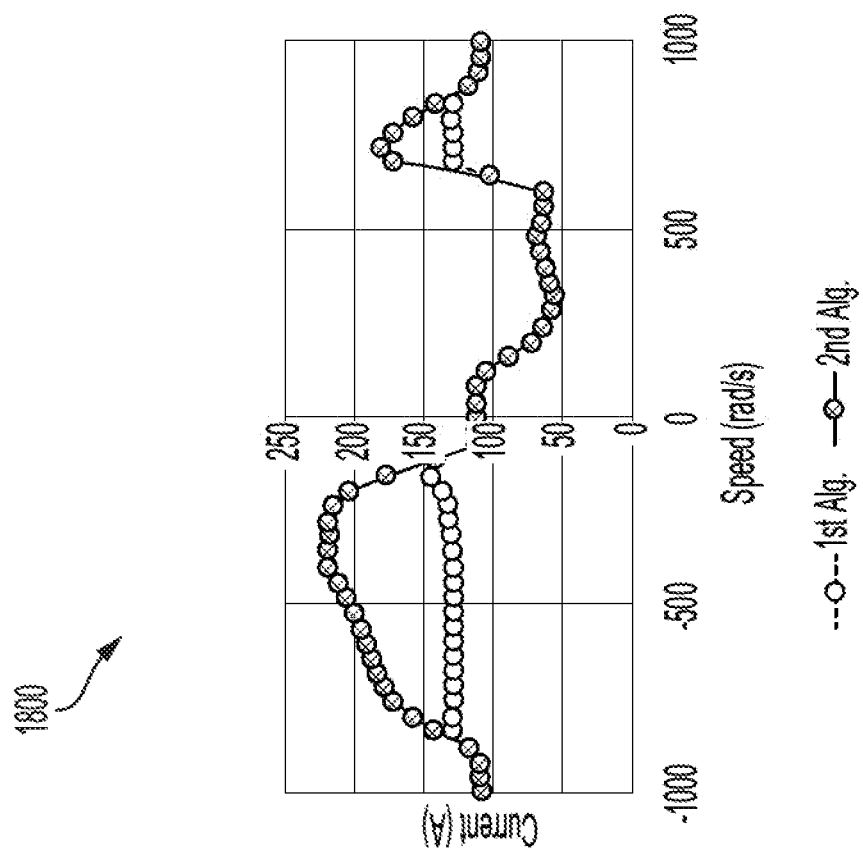
FIG. 18 depicts a graph of motor current of an example motor control system according to aspects of the present disclosure.

FIG. 18 depicts a graph 1800 of motor current of an example motor control system according to aspects of the present disclosure. Specifically, FIG. 18 includes a plot of motor current in the electric machine 19 at different speeds with the inverter 124 using the first algorithm 200 of the present disclosure ("1st Alg."), and using the second algorithm 300 of the present disclosure ("2nd Alg."). FIG. 19 depicts a graph 1900 of d-axis current $I_d$ of an example motor control system according to aspects of the present disclosure. Specifically, FIG. 19 includes a plot of d-axis current $I_d$ in the electric machine 19 at different speeds with the inverter 124 using the first algorithm 200 of the present disclosure ("1st Alg."), and using the second algorithm 300 of the present disclosure ("2nd Alg.").

Figure 20A:
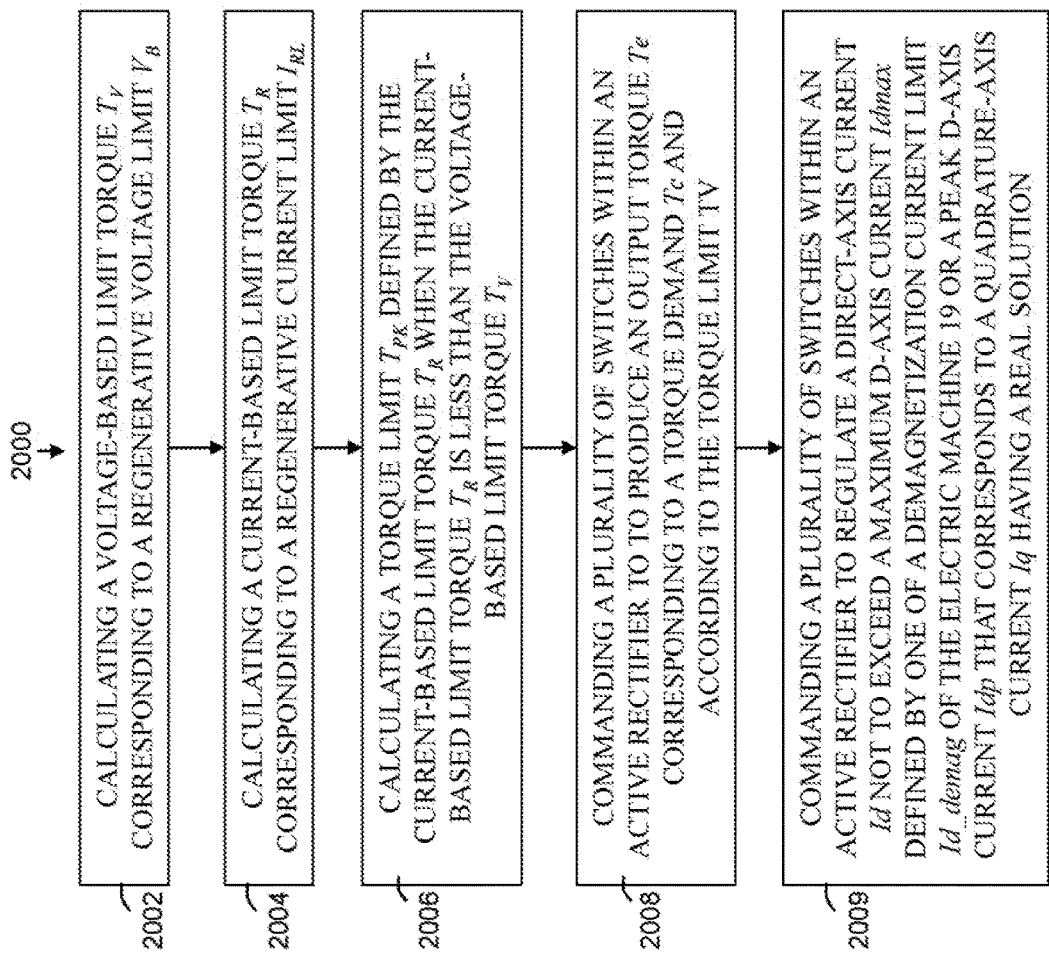
FIG. 20A depicts a flow diagram of a method for permanent magnet synchronous motor (PMSM) control in a steering system according to aspects of the present disclosure.
Figure 20B:
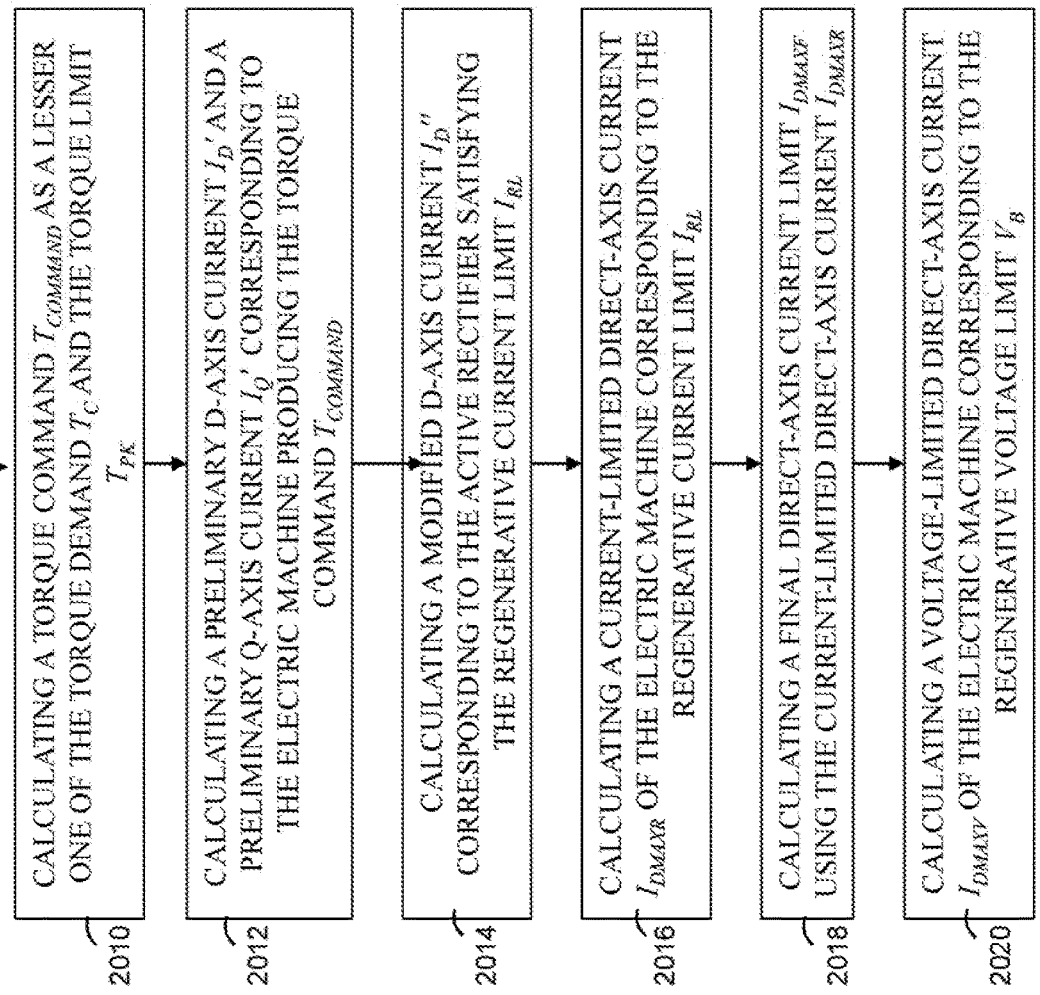
FIG. 20B depicts continuation of the flow diagram of FIG. 20A.

A method 2000 of controlling operation of an electric machine 19 is shown in the flow chart of FIGS. 20A-20B. The method 2000 includes calculating a voltage-based torque limit Tv corresponding to a voltage limit constraint $V_b$ of a direct current bus 12 at step 2002. The voltage limit constraint $V_b$ is a as a maximum voltage value for the direct current bus 12. The voltage limit constraint $V_b$ may depend on the characteristics of the battery 10 and/or other aspects of the vehicle power supply system.

The method 2000 also includes calculating a regenerative current limit-based torque $T_r$ corresponding to a regenerative current limit $I_{rl}$ of the direct current bus 12 at step 2004. The regenerative current limit $I_{rl}$ is a maximum current value that the inverter 124 is permitted to provide to the direct current bus 12. The regenerative current limit $I_{rl}$ may depend on the characteristics of the battery 10 and/or other aspects of the vehicle power supply system. In some embodiments, the step of calculating the regenerative current limit-based torque $T_r$ corresponding to the regenerative current limit $I_{rl}$ of the direct current bus 12 (step 2004) includes using the final direct-axis current limit $I_{dmaxf}$. Because the peak torque for a given regenerative current limit $I_{rl}$ occurs at the maximum d-axis motor current value, the final direct-axis current limit $I_{dmaxf}$ can be substituted into the equation used to calculate a corresponding q-axis current and then the regenerative current limit-based torque $T_r$.

The method 2000 also includes calculating a torque limit $T_{pk}$ defined by the regenerative current limit-based torque $T_r$ when the regenerative current limit-based torque $T_r$ is less than the voltage-based torque limit $T_v$ at step 2006. In some embodiments, the torque limit $T_{pk}$ is defined by the current-based torque limit $T_r$ when the regenerative current limit-based torque $T_r$ is less than or equal to the voltage-based torque limit $T_v$.

The method 2000 also includes commanding a plurality of switches within an inverter 124 to cause the electric machine 19 to produce an output torque $T_e$ corresponding to a torque demand $T_c$ and according to the torque limit $T_v$ at step 2008. This step 2008 may be performed by an inverter 124 under the command or direction of a controller 130.

The method 2000 also includes commanding the plurality of switches within the inverter 124 to regulate a direct-axis current $I_d$ not to exceed a maximum d-axis current $I_{dmax}$ at step 2009. The maximum d-axis current $I_{dmax}$ is defined by one of a demagnetization current limit $I_{d\_demag}$ of the electric machine 19 or a peak d-axis current $I_{dp}$ that corresponds to a quadrature-axis current $I_q$ having a real solution. This step 2009 may be performed by the inverter 124 under the command or direction of the controller 130.

In some embodiments, the direct-axis current $I_d$ is limited not to exceed a demagnetization current limit $I_{d\_demag}$ of the electric machine 19. For example, where the electric machine 19 is a permanent magnet synchronous motor (PMSM), direct-axis current $I_d$ currents in excess of the demagnetizing current limit $I_{d\_demag}$ may result in permanent magnets within the electric machine 19 becoming permanently demagnetized. In some embodiments, such demagnetization is prevented or avoided by limiting the direct-axis current $I_d$ not to exceed the demagnetization current limit $I_{d\_demag}$ of the electric machine 19. Alternatively, in some embodiments, the direct-axis current $I_d$ may be permitted to exceed the demagnetization current limit $I_{d\_demag}$ of the electric machine 19. For example, in an electric power steering (EPS) system, the direct-axis current $I_d$ may exceed the demagnetizing current limit $I_{d\_demag}$ during dynamic steering events such as braking over curbs. Such applications may be relatively infrequent and/or short in duration that risks of demagnetizing the electric machine 19 may be relatively low.

The method 2000 also includes calculating a torque command $T_{command}$ as a lesser one of the torque demand $T_c$ and the torque limit $T_{pk}$ at step 2010. This step 2010 may be performed, for example, by a torque command limiting (TCL) block 226, 326.

The method 2000 also includes calculating a preliminary d-axis current $I'_d$ and a preliminary q-axis current $I'_q$, collectively called $I'_{dq}$, corresponding to the electric machine producing the torque command $T_{command}$ at step 2012. This step 2012 may be performed, for example, using a maximum torque per ampere (MTPA) calculation, for example, by the MTPA block 240 of the first algorithm 200 or by the MTPA block 340 of the second algorithm 300.

The method 2000 also includes calculating a modified d-axis current $I''_d$ corresponding to the inverter 124 satisfying the regenerative current limit $I_{rl}$ of the direct current bus 12 at step 2014. This step 2014 may be performed, for example, using a regenerative current based d-axis motor current search (RCDC) calculation, for example, by the RCDC block 242 of the first algorithm 200 or by the RCDC block 342 of the second algorithm 300.

Figure 20C:
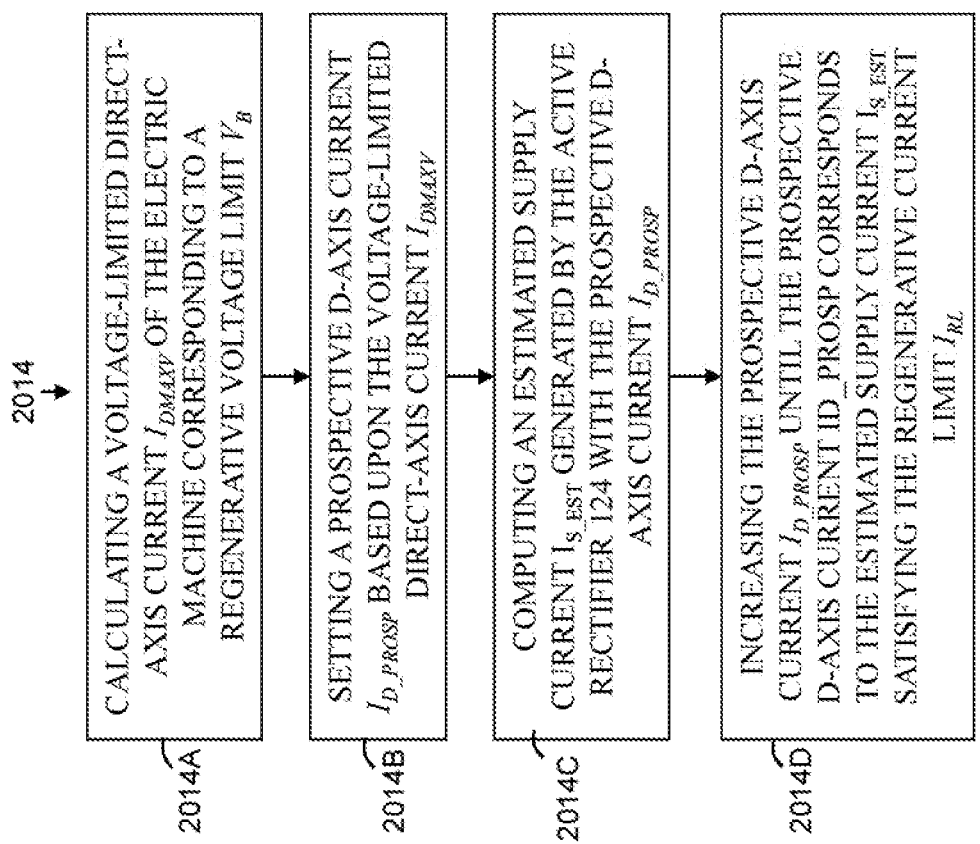
FIG. 20C depicts a flow diagram showing sub-steps of the method of FIG. 20A.

Step 2014 of calculating the modified d-axis current $I''_d$ corresponding to the inverter 124 satisfying the regenerative current limit $I_{rl}$ of the direct current bus 12 may compromise several sub-steps, as shown in the flow chart of FIG. 20C. In some embodiments, the RCDC block 242 is configured to perform the following sub-steps.

Step 2014 includes calculating a voltage-limited direct-axis current $I_{dmaxv}$ of the electric machine corresponding to the voltage limit constraint $V_b$ of the direct current bus 12 at sub-step 2014A. This sub-step 2014A may be performed, for example, by the maximum d-axis current for a voltage constraint (MDV) block 330.

Step 2014 also includes setting a prospective d-axis current $I_{d\_prosp}$ based upon the voltage-limited direct-axis current $I_{dmaxv}$ at sub-step 2014B. In some embodiments, the prospective d-axis current $I_{d\_prosp}$ is set equal to the voltage-limited direct-axis current $I_{dmaxv}$. In other words, the voltage-limited direct-axis current $I_{dmaxv}$ may be used as an initial value in a search.

Step 2014 also includes computing an estimated battery current $I_{s\_est}$ generated by the inverter 124 with the prospective d-axis current $I_{d\_prosp}$ at sub-step 2014C. This sub-step 2014C corresponds to testing each of the prospective d-axis current $I_{d\_prosp}$ to determine if the search is successful.

Step 2014 also includes increasing the prospective d-axis current $I_{d\_prosp}$ until the prospective d-axis current $I_{d\_prosp}$ corresponds to the estimated battery current $I_{s\_est}$ satisfying the regenerative current limit $I_{rl}$ at sub-step 2014D. The prospective d-axis current $I_{d\_prosp}$ may be increased in steps, and the steps may be fixed or variable.

The method 2000 also includes calculating a current-limited direct-axis current $I_{dmaxr}$ of the electric machine corresponding to the regenerative current limit $I_{rl}$ of the direct current bus 12 at step 2016. This step 2016 may be performed, for example, by the regenerative current constraint (MDR) block 332 of the second algorithm 300. The step of calculating the current-limited direct-axis current $I_{dmaxr}$ of the electric machine corresponding to the regenerative current limit $I_{rl}$ of the direct current bus 12 (step 2016) may compromise several sub-steps, as shown in the flow chart of FIG. 20D. In some embodiments, the MDR block 332 is configured to perform the following sub-steps. Step 2016 and its corresponding sub-steps are also described in the method 400 shown in the flow diagram of FIG. 7.

Step 2016 includes calculating a peak direct-axis current $I_{dp}$ corresponding to the inverter 124 providing a battery current $I_s$ to the direct current bus 12 less than the regenerative current limit $I_{rl}$ of the direct current bus 12 at sub-step 2016A. In some embodiments, the peak direct-axis current $I_{dp}$ corresponds to the inverter 124 providing a battery current $I_s$ to the direct current bus 12 less than or equal to the regenerative current limit $I_{rl}$ of the direct current bus 12. This sub-step 2016A corresponds to step 402 of the method 400 shown in the flow diagram of FIG. 7.

Step 2016 also includes calculating a regenerative current limit-based torque $T_{rp}$ corresponding to the regenerative current limit $I_{rl}$ of the direct current bus 12 using the peak direct-axis current $I_{dp}$ at sub-step 2016B. This sub-step 2016B corresponds to step 404 of the method 400 shown in the flow diagram of FIG. 7.

Step 2016 also includes calculating a peak voltage-based torque limit $T_{rv}$ corresponding to the voltage limit constraint $V_b$ of the direct current bus 12 using the peak direct-axis current $I_{dp}$ at sub-step 2016C. This sub-step 2016C corresponds to step 406 of the method 400 shown in the flow diagram of FIG. 7.

Step 2016 also includes using the peak direct-axis current $I_{dp}$ as the current-limited direct-axis current $I_{dmaxr}$ when the regenerative current limit-based torque $T_{rp}$ is less than the peak voltage-based torque limit $T_{rv}$ at sub-step 2016D. This sub-step 2016D corresponds to step 410 of the method 400 shown in the flow diagram of FIG. 7.

Step 2016 also includes calculating a value of the current-limited direct-axis current $I_{dmaxr}$ that is less than the peak direct-axis current $I_{dp}$ when the regenerative current limit-based torque $T_{rp}$ is not less than the peak voltage-based torque limit $T_{rv}$ at sub-step 2016E. In some embodiments, sub-step 2016E includes calculating a value of the current-limited direct-axis current $I_{dmaxr}$ that is less than or equal to the peak direct-axis current $I_{dp}$. This sub-step 2016E corresponds to step 412 of the method 400 shown in the flow diagram of FIG. 7. In some embodiments, sub-step 2016E includes using an interval bisection method. However, this sub-step 2016E may be performed using other known numerical techniques involving interval solvers.

The method 2000 also includes calculating a final direct-axis current limit $I_{dmaxf}$ using the current-limited direct-axis current $I_{dmaxr}$ at step 2018. This step 2014 may be performed, for example, by the maximum d-axis current arbitration (MDA) block 334 of the second algorithm 300.

In some embodiments, and as shown in the flow chart of FIG. 20E, the step of calculating the final direct-axis current limit $I_{dmaxf}$ using the current-limited direct-axis current $I_{dmaxr}$ (step 2018) further comprises setting the final direct-axis current limit $I_{dmaxf}$ equal to a largest one of the voltage-limited direct-axis current $I_{dmaxv}$ and the current-limited direct-axis current $I_{dmaxr}$ at sub-step 2018A. In other words, sub-step 2018 comprises using the largest one of the voltage-limited direct-axis current $I_{dmaxv}$ and the current-limited direct-axis current $I_{dmaxr}$ as the final direct-axis current limit $I_{dmaxf}$. This sub-step 2018A may be performed, for example, by the maximum d-axis current arbitration (MDA) block 334 of the second algorithm 300.

The method 2000 also includes calculating a voltage-limited direct-axis current $I_{dmaxv}$ of the electric machine corresponding to the voltage limit constraint $V_b$ of the direct current bus 12 at step 2020. This step 2020 may be performed, for example, by the maximum d-axis current for a voltage constraint (MDV) block 330 of the second algorithm 300.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate in scope with the present disclosure. Additionally, while various embodiments of the present disclosure have been described, it is to be understood that aspects of the present disclosure may include only some of the described embodiments or combinations of the various embodiments. Accordingly, the present disclosure is not to be seen as limited by the foregoing description.

What is claimed is:

1. A control system for controlling operation of an electric machine, comprising:
an inverter operable to rectify current from alternating current phase buses of the electric machine to a direct current bus with switches; and
a controller operable to:
calculate a voltage-based torque limit corresponding to a voltage limit constraint of the direct current bus;
calculate a current-based torque limit corresponding to a regenerative current limit of the direct current bus using an equation relating a total electrical power with a measured supply voltage of the direct current bus and the regenerative current limit of the direct current bus;
calculate a final torque limit defined by a lesser one of the current-based torque limit and the voltage-based torque limit;
operate the switches to cause the electric machine to produce an output torque corresponding to a torque demand and according to the final torque limit; and
operate the switches to regulate a direct-axis current not to exceed a maximum d-axis current, the maximum d-axis current defined by one of a demagnetization current limit of the electric machine or a peak d-axis current that corresponds to a solution of the equation relating the total electrical power with the supply voltage of the direct current bus and the regenerative current limit of the direct current bus.

2. The control system of claim 1, wherein the maximum d-axis current is defined by the peak d-axis current corresponding to the solution of the equation relating the total electrical power with the supply voltage of the direct current bus and the regenerative current limit of the direct current bus.

3. The control system of claim 1, wherein the maximum d-axis current is defined by the demagnetization current limit of the electric machine.

4. The control system of claim 3, wherein the demagnetization current limit is equal to $4K_e/(\sqrt{3} L_d N_p)$, where $K_e$ is a back electromagnetic force constant, $L_d$ is a direct-axis inductance of the electric machine, and $N_p$ is a number of poles of the electric machine.

5. The control system of claim 1, wherein the controller is further operable to:
calculate a torque command as a lesser one of the torque demand and the torque limit; and
calculate a preliminary d-axis current and a preliminary q-axis current corresponding to the electric machine producing the torque command.

6. The control system of claim 5, wherein the controller is further operable to:
calculate a modified d-axis current corresponding to the inverter satisfying the regenerative current limit of the direct current bus.

7. The control system of claim 6, wherein the controller is further operable to:
calculate a voltage-limited direct-axis current of the electric machine corresponding to the voltage limit constraint of the direct current bus;
set a prospective d-axis current equal to the voltage-limited direct-axis current;
compute an estimated battery current generated by the inverter with the prospective d-axis current; and
increase the prospective d-axis current until the prospective d-axis current corresponds to the estimated battery current satisfying the regenerative current limit.

8. The control system of claim 1, wherein the controller is further operable to:
- calculate a current-limited direct-axis current of the electric machine corresponding to the regenerative current limit of the direct current bus;
- calculate a final direct-axis current limit using the current-limited direct-axis current; and
- using the final direct-axis current limit to calculate the current-based torque limit corresponding to the regenerative current limit of the direct current bus.

9. The control system of claim 8, wherein the controller is further operable to:
- calculate a voltage-limited direct-axis current of the electric machine corresponding to the voltage limit constraint of the direct current bus; and
- wherein calculating the final direct-axis current limit using the current-limited direct-axis current further comprises using a largest one of the voltage-limited direct-axis current and the current-limited direct-axis current as the final direct-axis current limit.

10. The control system of claim 1, wherein the electric machine is configured to perform at least one of: applying an assist torque to a steering system of a vehicle, and controlling the steering system.

11. A method of controlling operation of an electric machine, comprising:
- calculating a voltage-based torque limit corresponding to a voltage limit constraint of a direct current bus;
- calculating a current-based torque limit corresponding to a regenerative current limit of the direct current bus using an equation relating a total electrical power with a measured supply voltage of the direct current bus and the regenerative current limit of the direct current bus;
- calculating a final torque limit defined by a lesser one of the current-based torque limit and the voltage-based torque limit;
- commanding a plurality of switches within an inverter to cause the electric machine to produce an output torque corresponding to a torque demand and according to the final torque limit; and
- commanding the plurality of switches to regulate a direct-axis current not to exceed a maximum d-axis current, the maximum d-axis current defined by one of a demagnetization current limit of the electric machine or a peak d-axis current that corresponds to a solution of the equation relating the total electrical power with the supply voltage of the direct current bus and the regenerative current limit of the direct current bus.

12. The method of claim 11, wherein the direct-axis current is defined by the demagnetization current limit of the electric machine.

13. The method of claim 11, further comprising:
- calculating a torque command as a lesser one of the torque demand and the torque limit; and
- calculating a preliminary d-axis current and a preliminary q-axis current corresponding to the electric machine producing the torque command.

14. The method of claim 13, further comprising:
- calculating a modified d-axis current corresponding to the inverter satisfying the regenerative current limit of the direct current bus.

15. The method of claim 14, wherein calculating the modified d-axis current corresponding to the inverter satisfying the regenerative current limit of the direct current bus further comprises:
- calculating a voltage-limited direct-axis current of the electric machine corresponding to the voltage limit constraint of the direct current bus;
- setting a prospective d-axis current based upon the voltage-limited direct-axis current;
- computing an estimated battery current generated by the inverter with the prospective d-axis current; and
- increasing the prospective d-axis current until the prospective d-axis current corresponds to the estimated battery current satisfying the regenerative current limit.

16. The method of claim 11, further comprising:
- calculating a current-limited direct-axis current of the electric machine corresponding to the regenerative current limit of the direct current bus;
- calculating a final direct-axis current limit using the current-limited direct-axis current; and
- wherein calculating the current-based torque limit corresponding to the regenerative current limit of the direct current bus includes using the final direct-axis current limit.

17. The method of claim 16, further comprising:
- calculating a voltage-limited direct-axis current of the electric machine corresponding to the voltage limit constraint of the direct current bus; and
- wherein calculating the final direct-axis current limit using the current-limited direct-axis current further comprises using a largest one of the voltage-limited direct-axis current and the current-limited direct-axis current as the final direct-axis current limit.

18. The method of claim 16, wherein calculating the current-limited direct-axis current of the electric machine corresponding to the regenerative current limit of the direct current bus further comprises:
- calculating a peak direct-axis current corresponding to the inverter providing a battery current to the direct current bus less than the regenerative current limit of the direct current bus;
- calculating a regenerative current limit-based torque corresponding to the regenerative current limit of the direct current bus using the peak direct-axis current;
- calculating a peak voltage-based torque limit corresponding to the voltage limit constraint of the direct current bus using the peak direct-axis current;
- using the peak direct-axis current as the current-limited direct-axis current when the regenerative current limit-based torque is less than the peak voltage-based torque limit; and
- calculating a value of the current-limited direct-axis current that is less than the peak direct-axis current when the regenerative current limit-based torque is not less than the peak voltage-based torque limit.

19. A method of controlling operation of an electric machine, comprising:
- calculating a voltage-limited direct-axis current of the electric machine corresponding to a voltage limit constraint of a direct current bus;
- calculating a current-limited direct-axis current of the electric machine corresponding to a regenerative current limit of the direct current bus;
- calculating a final direct-axis current limit as a largest one of the voltage-limited direct-axis current and the current-limited direct-axis current;
- calculating a current-based torque limit corresponding to the regenerative current limit of the direct current bus using an equation relating a total electrical power with a measured supply voltage of the direct current bus and the regenerative current limit of the direct current bus;

commanding a plurality of switches within an inverter to cause the electric machine to produce an output torque corresponding to a torque demand and according to the current-based torque limit; and commanding the plurality of switches to regulate a direct-axis current not to exceed the final direct-axis current limit or a peak d-axis current that corresponds to a solution of the equation relating the total electrical power with the supply voltage of the direct current bus and the regenerative current limit of the direct current bus.

20. The method of claim 19, further comprising:

calculating a peak direct-axis current corresponding to the inverter providing a battery current to the direct current bus less than the regenerative current limit of the direct current bus;

calculating a regenerative current limit-based torque corresponding to the regenerative current limit of the direct current bus using the peak direct-axis current;

calculating a peak voltage-based torque limit corresponding to the voltage limit constraint of the direct current bus using the peak direct-axis current;

using the peak direct-axis current as the current-limited direct-axis current when the regenerative current limit-based torque is less than the peak voltage-based torque limit; and calculating a value of the current-limited direct-axis current less than the peak direct-axis current when the regenerative current limit-based torque is not less than the peak voltage-based torque limit.

* * * * *